(12) United States Patent
Kim et al.

(10) Patent No.: US 8,486,613 B2
(45) Date of Patent: Jul. 16, 2013

(54) METHOD OF MANUFACTURING NANO-STRUCTURE AND METHOD OF MANUFACTURING A PATTERN USING THE METHOD

(75) Inventors: Sang-Ouk Kim, Daejeon (KR); Seong-Jun Jeong, Daejeon (KR); Su-Mi Lee, Yongin-si (KR); Bong-Hoon Kim, Daejeon (KR); Ji-Eun Kim, Daejeon (KR); Jae-Ho You, Kwaseong-si (KR); Moon-Gyu Lee, Suwon-si (KR); Seung-Ho Nam, Seongnam-si (KR)

(73) Assignees: Samsung Electronics Co., Ltd. (KR); Korea Advanced Institute of Science and Technology (KR)

(*) Notice: Subject to any disclaimer, the term of this patent is extended or adjusted under 35 U.S.C. 154(b) by 380 days.

(21) Appl. No.: 12/636,202

(22) Filed: Dec. 11, 2009

(65) Prior Publication Data

US 2010/0151393 A1    Jun. 17, 2010

(51) Int. Cl.
*G03F 7/26* (2006.01)

(52) U.S. Cl.
USPC .................................................... 430/324

(58) Field of Classification Search
USPC .................................................. 430/315, 323
See application file for complete search history.

(56) References Cited

U.S. PATENT DOCUMENTS

| | | | |
|---|---|---|---|
| 7,056,455 | B2 | 6/2006 | Matyjaszewski et al. |
| 7,347,953 | B2 | 3/2008 | Black et al. |
| 2002/0159010 | A1* | 10/2002 | Maeda et al. ............... 349/113 |
| 2006/0134556 | A1 | 6/2006 | Nealey et al. |
| 2007/0242352 | A1 | 10/2007 | MacMaster |
| 2008/0070010 | A1 | 3/2008 | Dravid et al. |
| 2008/0103256 | A1 | 5/2008 | Kim et al. |
| 2008/0217292 | A1 | 9/2008 | Millward et al. |
| 2008/0299353 | A1 | 12/2008 | Stoykovich et al. |
| 2008/0311402 | A1 | 12/2008 | Jung et al. |
| 2009/0047547 | A1 | 2/2009 | Hong et al. |
| 2009/0087664 | A1 | 4/2009 | Nealey et al. |

FOREIGN PATENT DOCUMENTS

| | | |
|---|---|---|
| JP | 2007-125699 | 5/2007 |
| JP | 2007-128086 | 5/2007 |
| JP | 2007-138052 | 6/2007 |
| JP | 2007-313568 | 12/2007 |
| JP | 2008-004304 | 1/2008 |
| JP | 2008-134599 | 6/2008 |
| JP | 2008-149447 | 7/2008 |
| JP | 2008-231233 | 10/2008 |
| KR | 10-2009-0001371 | 1/2009 |
| KR | 10-2009-0015742 | 2/2009 |
| KR | 10-2009-0028246 | 3/2009 |

* cited by examiner

Primary Examiner — Kathleen Duda
Assistant Examiner — Caleen Sullivan
(74) Attorney, Agent, or Firm — Cantor Colburn LLP

(57) ABSTRACT

According to an example embodiment of the present invention, a photoresist pattern is formed on a base substrate including a neutral layer. A sacrifice structure including a first sacrifice block and a second sacrifice block is formed on the base substrate having the photoresist pattern, and the sacrifice structure is formed from a first thin film including a first block copolymer. Thus, a chemical pattern is formed to form a nano-structure. Therefore, the nano-structure may be easily formed on a substrate having a large size by using a block copolymer, and productivity and manufacturing reliability may be improved.

23 Claims, 21 Drawing Sheets

METHOD OF MANUFACTURING NANO-STRUCTURE AND METHOD OF MANUFACTURING A PATTERN USING THE METHOD

This application claims priority to Korean Patent Applications No. 2008-126655, filed on Dec. 12, 2008, No. 2008-137025, filed on Dec. 30, 2008, No. 2009-101137, filed on Oct. 23, 2009, and all the benefits accruing therefrom under 35 U.S.C. §119, the contents of which are herein incorporated by reference in their entirety.

BACKGROUND OF THE INVENTION

1. Field of the Invention

Example embodiments of the present invention relate to a method of manufacturing a nano-structure and a method of manufacturing a pattern using the method. More particularly, example embodiments of the present invention relate to a method of manufacturing a nano-structure using a block copolymer and a method of manufacturing a pattern using the method.

2. Description of the Related Art

In recent, living organisms having a hierarchical structure by self-assembly have been found. Researches are focused on recreating a chemical method of forming a nano-structure and scientifically and commercially applying the method. The self-assembly may appear in a block copolymer that may be organic-chemically synthesized.

The block copolymer is one of polymeric materials, which includes at least two polymers, of which ends are connected to each other through a covalent bond. A diblock copolymer, which is a brief example of the block copolymer, includes two polymers that are different from each other and connected to each other. Since the two polymers are materially different from each other, the two polymers are easily phase-separated from each other so that the block copolymer forms a nano-structure through self-assembling.

It is important to form a thin film on a substrate and to induce forming a stable nano-structure in the thin film so that a nano-structure is formed using a block copolymer. However, a block copolymer in a thin film may form an arrangement of a nano-structure that is different from an arrangement in a bulk or different from a desired arrangement because of interaction of a self-assembling material and a substrate. In order to solve the above-mentioned problems, researches have been conducted on methods for controlling arrangement or orientation of a nano-structure in a thin film. In order to control arrangement or orientation of a nano-structure in a thin film, using an electric field or methods such as epitaxial self-assembly, graphoepitaxy and the like are conventionally used. However, the above-mentioned conventional methods barely form a uniform nano-structure on a large-sized substrate.

U.S. Pat. No. 7,056,455 that is assigned to Carnegie Mellon University describes a method of forming a nano-structure, which is a representative example of the methods for forming a nano-structure. According to U.S. Pat. No. 7,056,455, a precursor including a block copolymer is decomposed by heat to form a carbon nano-structure such as a carbon nano-fiber, a carbon nano-tube, a carbon nano-cylinder and the like.

US Published Patent 2008-0070010 describes a method of forming a nano-pattern using an organic material or an inorganic material. US Published Patent 2008-0070010 relates a method of manufacturing a nano-pattern, a nano-structure and a functional nano-patterned oxidized material. According to the above-mentioned method, a resist-coated substrate is patterned through an electron-beam lithography, and a resist is removed to form a patterned resist-coated substrate. Thereafter, a liquid precursor including a polymer is spin-coated. Thereafter, a remaining resist is removed to form a nano-patterned structure. However, the method also includes a step of removing a resist used in a lithography process.

BRIEF SUMMARY OF THE INVENTION

Example embodiments of the present invention provide a method of manufacturing a nano-structure using a block copolymer.

Example embodiments of the present invention also provide a method of manufacturing a pattern using a block copolymer.

According to an example embodiment of the present invention, a photoresist pattern is formed on a base substrate including a neutral layer. A sacrifice structure including a first sacrifice block and a second sacrifice block is formed on the base substrate having the photoresist pattern, the sacrifice structure formed from a first thin film including a first block copolymer. The first sacrifice block is removed from the sacrifice structure. The neutral layer is oxidized by using the second sacrifice block as a mask to form a chemical pattern. The second sacrifice block and the photoresist pattern are removed from the base substrate having the chemical pattern. A nano-structure is formed on the base substrate having the chemical pattern, and the nano-structure is formed from a second thin film including a second block copolymer.

The first and second block copolymers may be substantially the same.

The first and second block copolymers may have a lamella shape or a cylindrical shape.

The photoresist pattern may include a plurality of partition portions extending in a first direction on the base substrate and being repeatedly arranged in a second direction different from the first direction, and the first thin film and the sacrifice structure may be formed between the partition portions adjacent to each other.

According to an example embodiment of the present invention, a photoresist pattern is formed on a base substrate. The photoresist pattern includes a convex portion and a concave portion, which are repeatedly arranged in a first direction and extend in a second direction different from the first direction. A neutral layer is formed on the base substrate having the photoresist pattern. A nano-structure is formed on the base substrate having the neutral layer, and the nano-structure is formed from a thin film including a block copolymer.

In order to form the photoresist pattern, a plurality of supporting patterns extending in the second direction and being spaced apart from each other in the first direction may be formed. A photoresist composition may be coated on the base substrate having the supporting patterns to form the convex portion in an area overlapping with the supporting pattern. The concave portion is formed between the supporting patterns adjacent to each other.

Alternatively, the photoresist pattern may be formed by using a half-tone mask including a light-blocking portion corresponding to the convex portion and a half-tone portion corresponding to the concave portion.

According to an example embodiment of the present invention, a photoresist pattern is formed on a base substrate. A buffer structure is formed on the base substrate having the photoresist pattern, the buffer structure being formed from a buffer layer including a cylindrical block copolymer, and forming a nano-structure on the base substrate having the buffer structure, the nano-structure being formed from a thin film including a lamella-shaped block copolymer.

The photoresist pattern may include a plurality of partition portions extending in a first direction on the base substrate and being repeatedly arranged in a second direction different from the first direction, and the first thin film and the sacrifice structure may be formed between the partition portions adjacent to each other. The buffer structure may include a plurality of nano-cylinders, a plurality of half-cylinders and a substrate. The nano-cylinders extend in the first direction between the partition portions adjacent to each other and are arranged in the second direction. The half-cylinders are disposed on the base substrate having the partition portions and the nano-cylinders, and extend in the first direction and are arranged in the second direction. The substrate is disposed between the nano-cylinders and the half-cylinders.

According to an example embodiment of the present invention, a sacrifice structure is formed on a base substrate having a mother thin film, a neutral layer and a photoresist pattern, which are sequentially formed on the base substrate. The sacrifice structure includes a first sacrifice block and a second sacrifice block and is formed from a first thin film including a first block copolymer. The first sacrifice block is removed from the sacrifice structure. The neutral layer is oxidized by using the second sacrifice block to form a chemical pattern. The second sacrifice block and the photoresist pattern are removed from the base substrate having the chemical pattern. A nano-structure is formed on the base substrate having the chemical pattern. The nano-structure includes a first nano-block and a second nano-block and is formed from a second thin film including a second block copolymer. The first nano-block is removed. The mother thin film is patterned by using the second nano-block as a mask to form a pattern.

The pattern may have a linear grid shape.

The pattern may have a cylindrical shape.

According to an example embodiment of the present invention, a photoresist pattern is formed on a base substrate including a metal layer. A buffer layer including a cylindrical block copolymer is formed on the base substrate having the photoresist pattern. A buffer structure is formed from the buffer layer. A thin film including a lamella-shaped block copolymer is formed on the base substrate having the buffer structure, and a nanostructure including a first nano-block and a second nano-block is formed on the buffer structure from the thin film. The first nano-block and a portion of the buffer structure disposed under the first nano-block are removed. A portion of the metal layer exposed through a remaining portion of the buffer structure and the second nano-block is patterned to form a linear grid pattern.

According to an example embodiment of the present invention, a photoresist pattern is formed on a base substrate. The photoresist pattern includes a convex portion and a concave portion, which extend in a first direction and are repeatedly arranged in a second direction different from the first direction. A metal layer and a neutral layer are sequentially formed on the base substrate having the photoresist pattern. A nano-structure is formed on the base substrate having the neutral layer. The nano-structure includes a first nano-block and a second nano-block and is formed from a thin film including a block copolymer. After the first nano-block is removed, the metal layer is patterned by using the second nano-block as a mask to form a linear grid pattern.

According to an example embodiment of the present invention, a metal layer formed on a base substrate is patterned to form a metal pattern including a first thickness portion and a second thickness portion thinner than the first thickness portion. A buffer structure is formed on the base substrate having the metal pattern. The buffer structure is formed from a buffer layer including a cylindrical block copolymer. A nano-structure is formed on the base substrate having the buffer structure. The nano-structure includes a first nano-block and a second nano-block and is formed from a preliminary layer including a lamella-shaped block copolymer. The first nano-block and a portion of the buffer structure disposed under the first nano-block are removed. The metal film exposed through a remaining portion of the buffer structure and the second nano-block is patterned to form a linear grid pattern.

According to example embodiments of the present invention, a repeatedly arranged nano-structure may be easily formed on a substrate having a large-size by using a block copolymer. Therefore, productivity and manufacturing reliability of a nano-structure and a polarization plate may be improved.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Figure 1A:
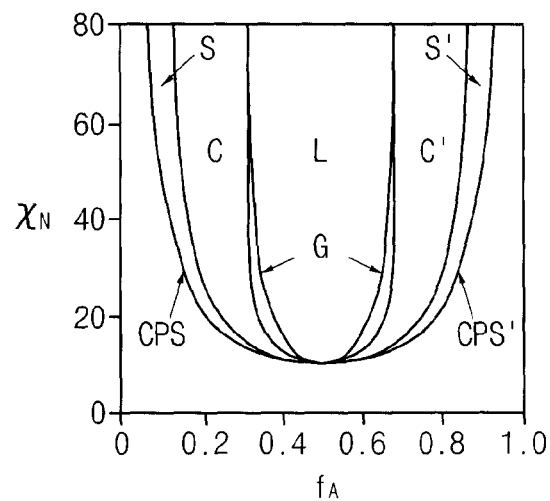
FIGS. 1A, 1B and 1C are views explaining various nano-structures of a block copolymer, which is formed depending on composition ratio of a polymer.

The present invention is described more fully hereinafter with reference to the accompanying drawings, in which exemplary embodiments of the present invention are shown. The present invention may, however, be embodied in many different forms and should not be construed as limited to the exemplary embodiments set fourth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "lower" other elements or features would then be oriented "upper" the other elements or features. Thus, the exemplary term "lower" can encompass both an orientation of above and below. The apparatus may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of an apparatus and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be explained in detail with reference to the accompanying drawings. Firstly, various nano-structures formed using a block copolymer will be explained with reference to FIG. 1, and a method of forming the nano-structures and a method of manufacturing a pattern using the method of forming the nano-structures will be explained. The nano-structures is described by Korea Patent Application 10-2007-0051020 (Published Number 10-2008-0103812) which is assigned to Korea Advanced Institute of Science and Technology who is a common assignee of the application.

Figure 1B:
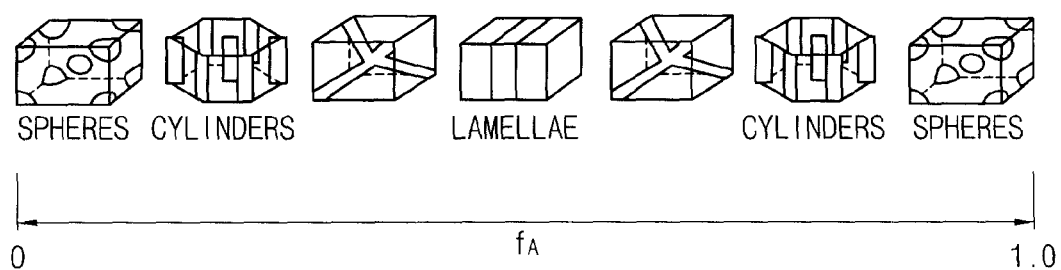
Figure 1C:
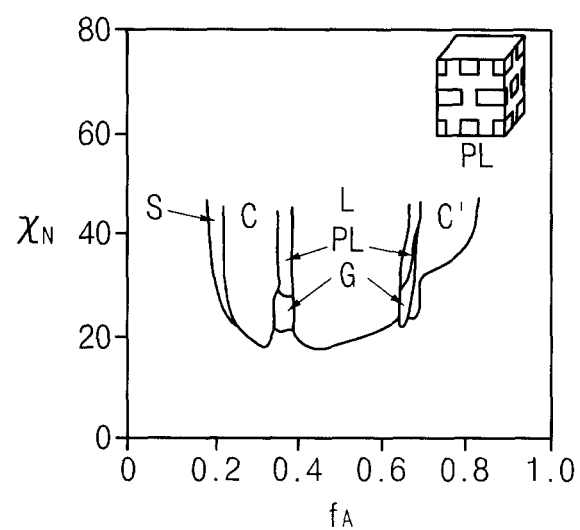

FIGS. 1A, 1B and 1C are views explaining various nano-structures of a block copolymer, which is formed depending on composition ratio of a polymer.

Particularly, FIG. 1A is a phase diagram representing a self-assembled nano-structure of a diblock copolymer, which is expected according to Self-consistent Mean Field theory. FIG. 1B is a schematic view illustrating a nano-structure of a diblock copolymer that is formed depending on a ratio of two polymers. FIG. 1C is a phase diagram representing a self-assembled nano-structure experimentally formed according to examples of the present invention.

In FIGS. 1A and 1B, x axis represents $f_A$, and y axis represents a size of a polymer ($\chi_N$). N represents degree of polymerization, and $\chi$ represents interaction of two blocks. When A represents a first polymer block, and when B represents a second polymer block, $f_A$ represents a relative ratio of A, which is represented as $N_A/(N_A+N_B)$, and $f_B$ represents a relative ratio of B, which is represented as $N_B/(N_A+N_B)$. Examples of a polymer that may be used for the first polymer block may include poly(methylmethacrylate) (PMMA), poly(ethyleneoxide) (PEO), poly(vinylpyridine) (PVP), poly(ethylene-alt-propylene) (PEP), polyisoprene (PI) and the like. Examples of a polymer that may be used for the second polymer block may include polystyrene.

Referring to FIG. 1A, when $\chi_N$ is less than 10, the block copolymer is randomly formed. When $\chi_N$ is greater than 10 and less than 100, and when $f_A$ is no more than about 0.18 to about 0.12, a nano-structure having a sphere shape in a body centered cubic, which is surrounded by a matrix of the second polymer block. When $f_A$ is no more than about 0.30 to about 0.35, a nano-domain forms a cylindrical nano-structure in a hexagonal lattice. When $f_A$ is in a range of about 0.35 to about 0.40, a nano-structure having a gyroid shape including two successively connected cylinders is formed. When $f_A$ is about 0.5, a nano-structure having a lamellae shape is formed.

When $f_B$ is in a range of about 0.18 to about 0.23, a nano-structure having a sphere shape in a body centered cubic, which is surrounded by a matrix of the first polymer block. When $f_B$ is no more than about 0.30 to about 0.35, a nano-domain forms a cylindrical nano-structure in a hexagonal lattice. When $f_B$ is in a range of about 0.35 to 0.40, a nano-structure having a gyroid shape including two successively connected cylinders is formed. When $f_B$ is about 0.5, a nano-structure having a lamellae shape is formed.

Referring to FIG. 1C, the graph of FIG. 1C is similar to the graph of FIG. 1A. Thus, it can be noted by people skilled in the art that results of FIG. 1C may be included in results of FIG. 1A.

Embodiment 1

Nano-Structure

Figure 2:
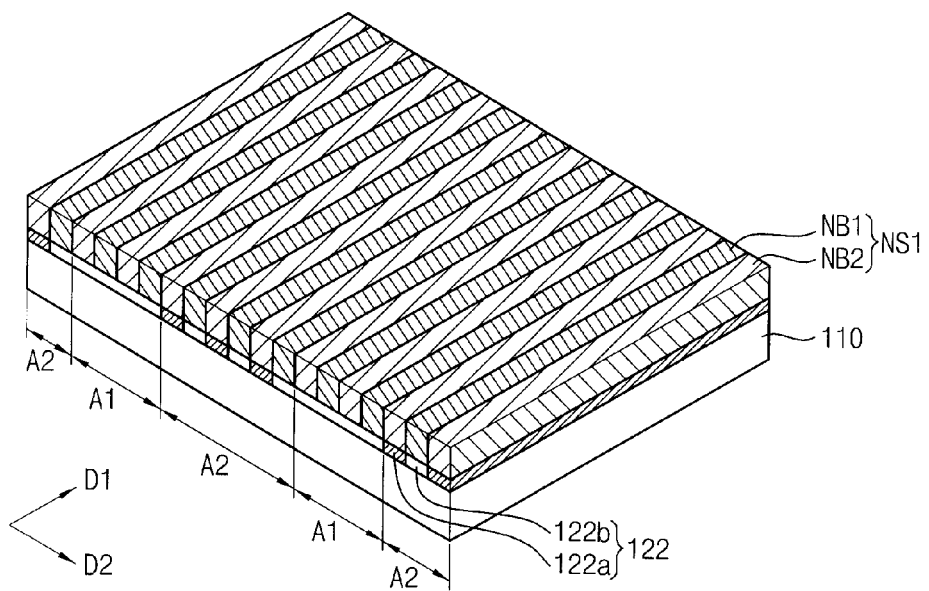
FIG. 2 is a perspective view illustrating a nano-structure manufactured according to an example embodiment of the present invention.

FIG. 2 is a perspective view illustrating a nano-structure manufactured according to an example embodiment of the present invention.

Referring to FIG. 2, a first nano-structure NS1 includes a plurality of first nano-blocks NB1 and a plurality of second nano-blocks NB2, which are formed on a base substrate 110. The nano-structure formed according to the embodiment is described in Korean Patent Applications No. 2008-126655, which is commonly assigned to Korea Advanced Institute of Science and Technology and the assignee of the application. The nano-structure formed according to the embodiment has a lamellae shape as illustrated in FIG. 1B.

The first nano-blocks NB1 extend in a first direction D1 on the base substrate 110, and are arranged in a second direction D2 different from the first direction D1 to be spaced apart from each other. The second direction D2 may be perpendicular to the first direction D1. The second nano-blocks NB2 extend in the first direction D1, and are arranged in the second direction D2 to be spaced apart from each other. Each of the second nano-blocks NB2 is disposed between adjacent first nano-blocks NB1.

Examples of a material that may be used for the first nano-blocks NB1 may include poly(methylmethacrylate) (PMMA), poly(ethyleneoxide) (PEO), poly(vinylpyridine) (PVP), poly(ethylene-alt-propylene) (PEP), polyisoprene (PI) and the like. Examples of a material that may be used for the second nano-blocks NB2 may include polystyrene. The first nano-structure may be formed from a block copolymer including a first polymer and a second polymer in a ratio of about 50:50, the first polymer forming the first nano-blocks NB1, the second polymer forming the second nano-blocks NB2.

The first nano structure NS1 may further include a chemical pattern layer 122 formed on the base substrate 110. The chemical pattern layer 112 includes a chemical pattern 122a that is hydrophobic or hydrophilic, and a neutral pattern 122b that is not either hydrophobic or hydrophilic. A first area A1 on the base substrate 110 includes the neutral pattern 122b, and a second area A2 adjacent to the first area A1 includes the chemical pattern 122a and the neutral pattern 122b. A photoresist pattern is formed on the first area A1 in the process of forming the first nano structure NS1, and a photoresist pattern is not formed in the second area A2 so that a neutral layer is exposed. On the second area A2, the chemical pattern 122a and the neutral pattern 122b are alternatively arranged in the second direction D2.

Method of Manufacturing a Nano-Structure

FIGS. 3A, 3B, 3C, 3D, 3E and 3F are perspective views illustrating a method of manufacturing the nano-structure illustrated in FIG. 2.

Figure 3A:
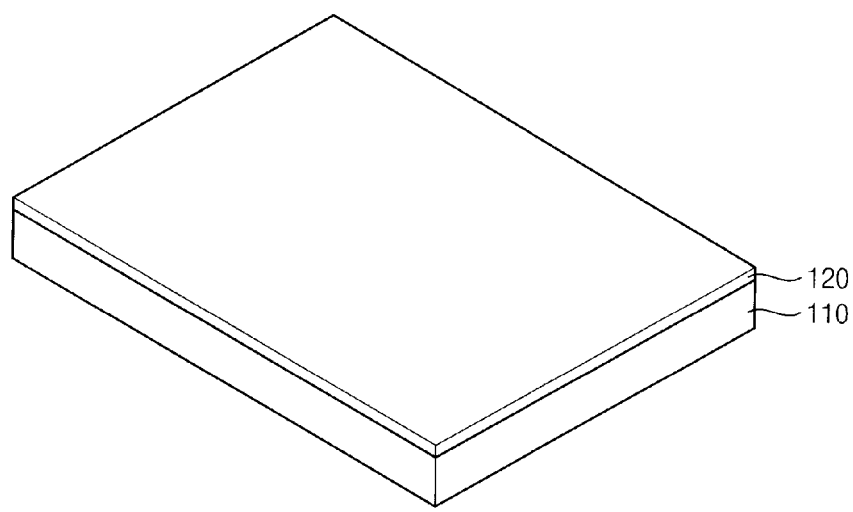
FIGS. 3A, 3B, 3C, 3D, 3E and 3F are perspective views illustrating a method of manufacturing the nano-structure illustrated in FIG. 2.

Referring FIG. 3A, a neutral layer 120 is formed on the base substrate 110.

The base substrate 110 may include a glass substrate.

The neutral layer 120 helps the first and second nano-blocks NB1 and NB2 to stably grow in a vertical direction with respect to a surface of the base substrate 110. The neutral layer 120 is chemically neutral. Thus, the neutral layer 120 is not either hydrophobic or hydrophilic. The neutral layer 120 includes a self-assembled monolayer (SAM), a polymer brush and a cross-linked random copolymer mat or an organic monolayer including a cross-linked random copolymer mat.

Examples of a material that may be used for the self-assembled monolayer may include phenethyltrichlorosilane (PETCS), phenyltrichlorosilane (PTCS), benzyltrichlorosilane (BZTCS), tolyltrichlorosilane (TTCS), 2-[(trimethoxysilyl)ethl]-2-pyridine (PYRTMS), 4-biphenylyltrimethowysilane (BPTMS), octadecyltrichlorosilane (OTS), 1-naphthyltrimehtoxysilane (NAPTMS), 1-[(trimethoxysilyl)methyl]naphthalene (MNATMS), (9-methylanthracenyl) trimethoxysilane (MANTMS), and the like.

Examples of a material that may be used for the polymer brush may include polystyrene-random-poly(methylmethacrylate) (PS-random-PMMA) and the like.

Examples of a material that may be used for the cross-linked random copolymer mat may include benzocyclobutene-functionalized polystyrene-r-poly(methacrylate) copolymer P(s-r-BCB-r-MMA) and the like.

A surface of the base substrate 110 may be pre-treated using an acid solution before the neutral layer 120 is formed on the base substrate 110. Thus, an affinity between the base substrate 110 and the neutral layer 120 may be increased. Examples of the acid solution may include hydrofluoric acid.

In the embodiment, the neutral layer 120 includes PS-random-PMMA.

Figure 3B:
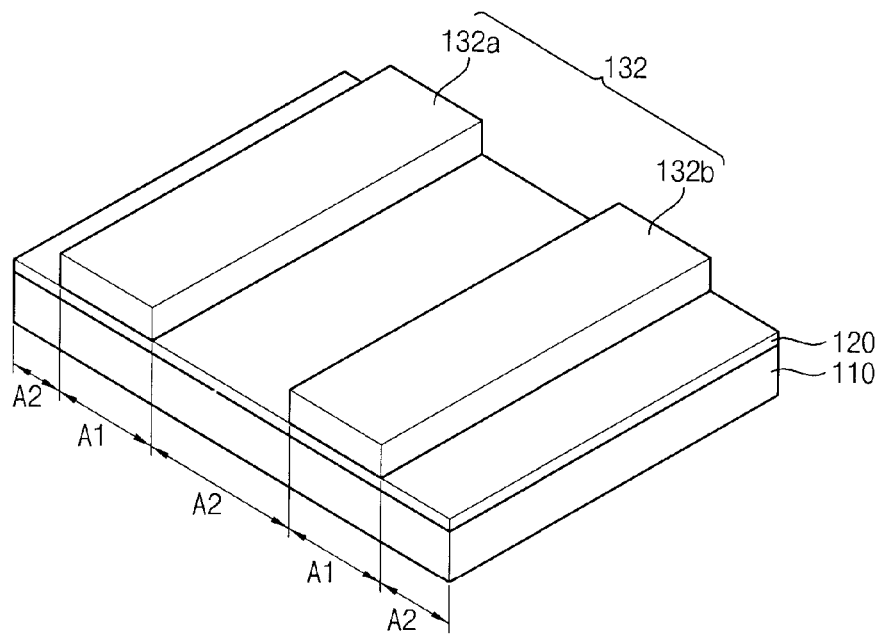

Referring to FIG. 3B, a photoresist pattern 132 is formed on the base substrate 110 having the neutral layer 120. The photoresist pattern 132 is formed only on the first area A1. The photoresist pattern 132 includes a first partition portion 132a and a second partition portion 132b. The first and second partition portions 132a and 132b extend in the first direction D1, and are arranged in the second direction D2 to be disposed adjacent to each other. The neutral layer 120 on the second area A2 is exposed through a gap between the first and second partition portions 132a and 132b.

Examples of a method that may form the photoresist pattern may include a photolithography method, a soft lithography method, a nano-imprinting method, a scanning probe lithography method and the like.

According to the photolithography method, a photoresist film is formed on the neutral layer 120. Thereafter, light is irradiated onto the photoresist film through a mask disposed on the photoresist film, and the photoresist film is developed to form the photoresist pattern 132. Examples of a light source that may be used for the photolithography method may include a g-line having a wavelength of about 436 nm, an h-line having a wavelength of about 405 nm, an i-line having a wavelength of about 365 nm, a KrF laser having a wavelength of about 248 nm, an ArF laser having a wavelength of about 193 nm, a deep ultraviolet (DUV) ray having a wavelength of about 157 nm, an X-ray, an electron beam, an extreme ultraviolet ray having a wavelength of about 13.5 nm, and the like.

According to the soft lithography method, an alkanethiol solution may be printed on the photoresist film by using an elastomaric poly(dimethylsiloxane) stamp to form the photoresist pattern 132.

According to the nano-implanting method, the photoresist film may be heated to be flexible, and the photoresist film may be pressed by a mold having pattern to form the photoresist pattern 132.

According to the scanning probe lithography method, a surface of the photoresist film is pressed by a micro-tip of a probe to deform the photoresist film. As a result, the photoresist pattern 132 may be formed.

The photoresist film may be formed from a composition that may be used for conventional method of manufacturing a semiconductor device or a liquid crystal display device. The photoresist film should not be damaged by a material for removing a first sacrifice block 144a. Examples of a material that may be used for the photoresist film may include novolac resins, polyvinylphenol (PVP), acrylates, Norbornene, polytetrafluoroethylene (PTFE), silsesquioxane, polymethylmethacrylate (PMMA), Terpolymer, poly(1-butene sulfone) (PBS), novolac-based positive electron resist (NPR), poly(methyl-a-chloroacrylate-co-a-methyl styrene, poly(glycidyl methacrylate-co-ethyl acrylate), polychloromethylstyrene (PCMS) and the like. The photoresist pattern 132 is formed from an organic material. Thus, the photoresist pattern 132 may be easily removed from the base substrate 110 with compared to a photoresist pattern formed from an inorganic material.

When the light source is a g-line, an h-line or an i-line, the photoresist pattern may be preferably formed from a novolac resin. When the light source is a KrF laser, the photoresist pattern may be preferably formed from PVP. When the light source is an ArF laser, the photoresist pattern may be preferably formed from acrylates or Norbornene. When the light source is DUV or an excimer laser, the photoresist pattern may be preferably formed from PTFE or silsesquioxane. When the light source is an X-ray, an electron beam, an extreme ultraviolet ray or an ion beam, the photoresist pattern may be preferably formed from PMMA, Terpolymer, PBS, NPR, poly(methyl-a-chloroacrylate-co-a-methyl styrene, poly(glycidyl methacrylate-co-ethyl acrylate) or PCMS.

The photoresist pattern 132 controls orientation of the block copolymer. When an aspect ratio of the photoresist pattern 132 increases, a correlation length of the block copolymer increases. Thus, the block copolymer may be easily arranged, and may not overflow toward outside of the base substrate 110. For example, a thickness of the photoresist pattern 132 may be about 100 nm to about 1 um. Furthermore, a gap between the first and second partition portions 132a and 132b may be about 1 nm to about 900 nm.

Figure 3C:
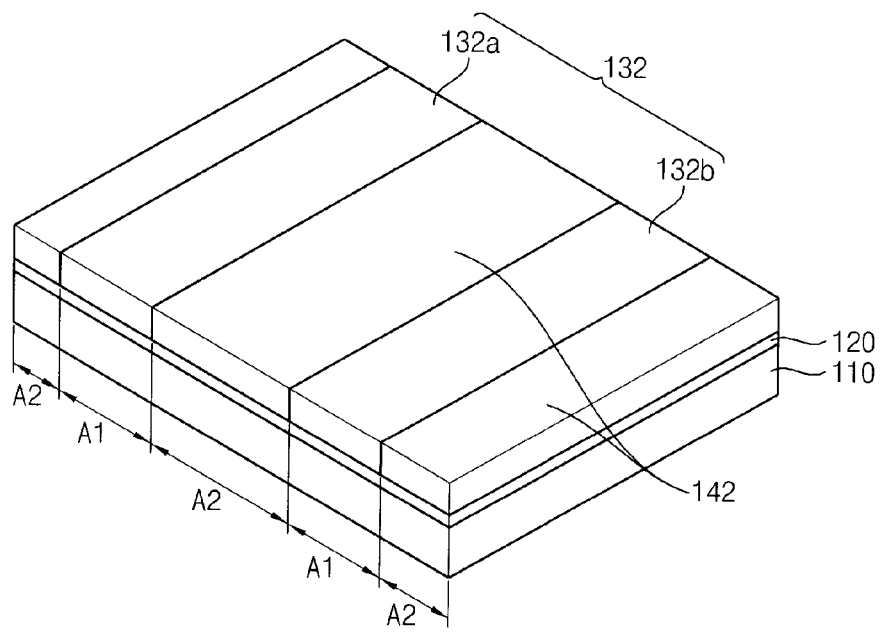

Referring to FIG. 3C, a first thin film 142 including a first block copolymer is formed on the base substrate 110 having the photoresist pattern 132.

The first thin film 142 is formed on the neutral layer 120 on the second area A2. The block copolymer has a covalent bond of two different monomers. The two different monomers have difference physical and chemical characteristics. Thus, a first monomer may be relatively hydrophilic with compared to a second monomer, and the second monomer may be relatively hydrophobic with compared to the first monomer. In the embodiment, the first block copolymer contains polystyrene and a polymer covalent-bonded with the polystyrene.

Examples of the first block copolymer may include polystyrene-block-poly(methylmethacrylate) (P S-b-PMMA), polystyrene-block-poly(ethylene oxide), (P S-b-PEO), polystyrene-block-poly(vinyl pyridine), (P S-b-PVP), Polystyrene-block-poly(ethylene-alt-propylene) (PS-b-PEP), polystyrene-block-polyisoprene (PS-b-PI) and the like.

In the embodiment, the first block copolymer includes (PS-b-PMMA).

Thereafter, the base substrate 110 having the first thin film 142 is heated. For example, the base substrate 110 may be heated at a temperature of about 200° C. to about 300° C. for about 40 hours to about 60 hours.

Figure 3D:
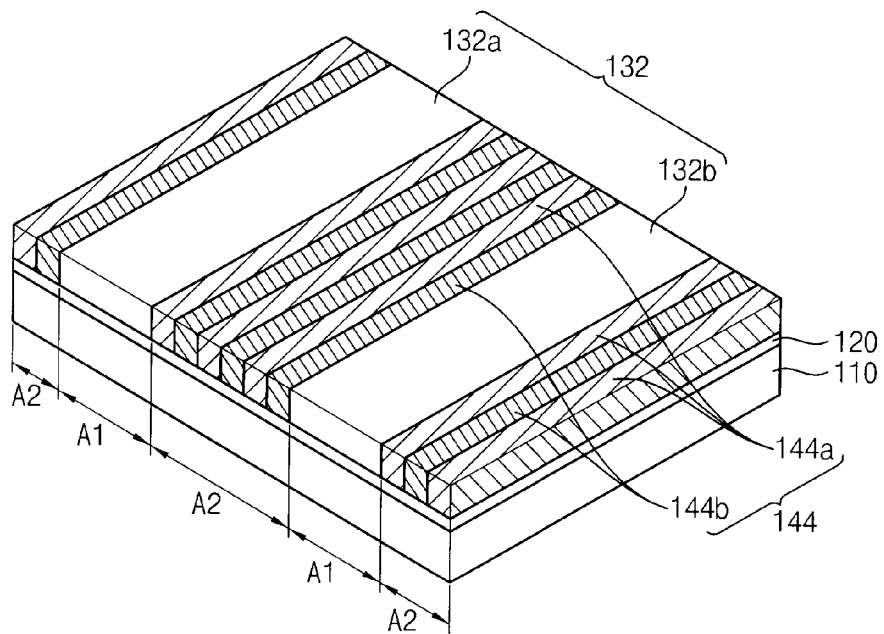

Referring to FIG. 3D, when the base substrate 110 is heated, the first thin film 142 is changed to a sacrifice structure 144 including a first sacrifice block 144a and a second sacrifice block 144b.

The first block copolymer of the thin film 142 is arranged in the first direction D1, and the polystyrene and the polymer of the first block copolymer are phase-separated in the second direction D2. Accordingly, the first sacrifice block 144a extending in the first direction D1 is formed, and the second sacrifice block 144b that is phase-separated from the first sacrifice block 144a and spaced apart from the first sacrifice block 144a in the second direction D2 is formed. In the embodiment, the first sacrifice block 144a includes PMMA, and the second sacrifice block 144b includes polystyrene (PS).

The first block copolymer may have various shapes depending on ratios of the first and second monomers. The first block copolymer may have a lamella shape, when the ratio of the first and second monomers is about 50:50.

Figure 3E:
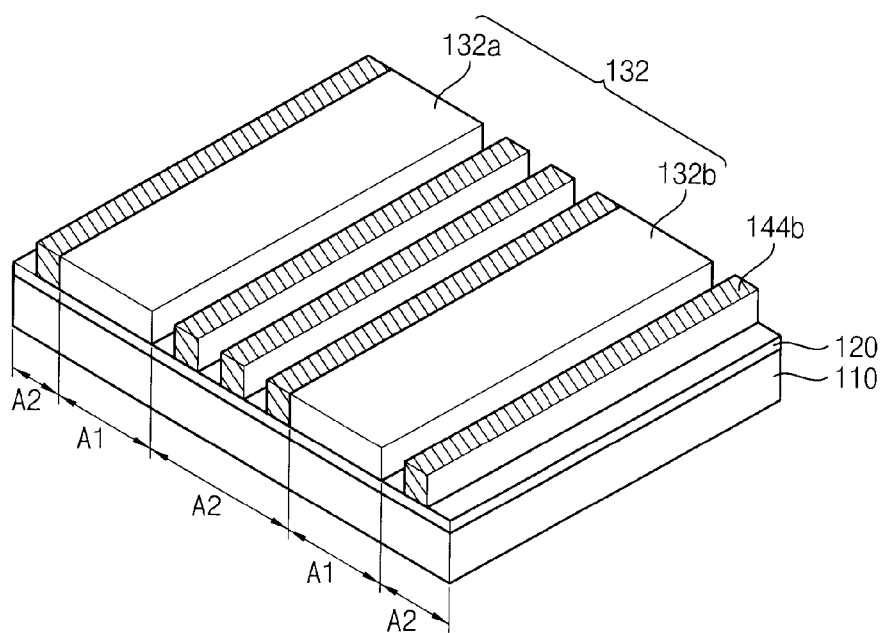

Referring to FIG. 3E, the first sacrifice block 144a is removed from the sacrifice structure 144. Thus, the second sacrifice block 144b and the photoresist pattern 132 remain on the neutral layer 120.

The first sacrifice block 144a may be removed through a wet-etching process. For example, the base substrate 110 with the sacrifice structure 144 is dipped into a solution including acetic acid, and then processed with sonication. As a result, the first sacrifice block 144a may be selectively removed from the sacrifice structure 144. Alternatively, the first sacrifice block 144a may be removed through a dry-etching process. For example, after the sacrifice structure 144 is exposed to an ultraviolet ray, the first sacrifice block 144a may be selectively removed due to difference of etching selectivity through a reactive ion etching (RIE) process.

The neutral layer 120 is oxidized by using the photoresist pattern 132 and the second sacrifice block 144b as a mask. For example, the neutral layer 120 may be oxidized through a RIE process using oxygen plasma, or may be oxidized using an ultraviolet ray ozone generating device. Alternatively, the neutral layer 120 may be oxidized by an X ray.

Figure 3F:
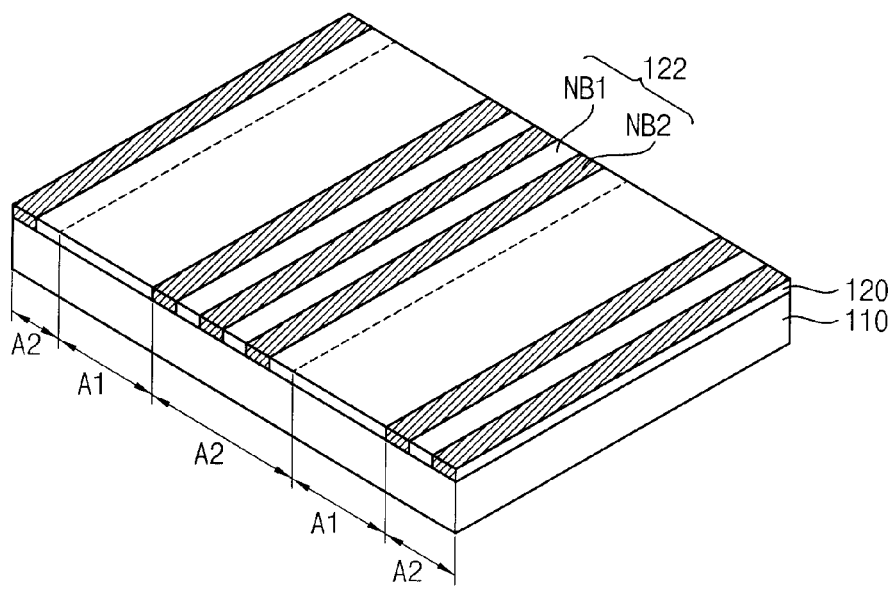

Referring to FIG. 3F, the chemical pattern 122a is formed in a portion of the second area A2 through oxidization of the neutral layer 120. Furthermore, a neutral pattern 122b having characteristics of the neutral layer 120 is formed in a remaining portion of the second area A2.

Thereafter, the second sacrifice block 144b and the photoresist pattern 132 are removed. For example, the base substrate 110 with the second sacrifice block 144b and the photoresist pattern 132 is dipped into a solution including toluene, and then processed with sonication to remove the second sacrifice block 144b and the photoresist pattern 132.

A second thin film including a second block copolymer is formed on the base substrate 110 having the chemical pattern 122a. The second block copolymer is substantially the same as the first block copolymer. The base substrate 110 with the second thin film is heated.

When the base substrate 110 with the second thin film is heated, the first nano-block NB1 is formed on the chemical pattern 122a, and the second nano-block NB2 is formed on the neutral pattern 122b. Thus, the first nano-structure NS1 is formed on the base substrate 110.

A polymer of the second block copolymer, which is relatively hydrophilic, is disposed on the chemical pattern 122a, and a polymer of the second block copolymer, which is relatively hydrophobic, is disposed on the neutral pattern 122b. Thus, a coupling is induced on the neutral pattern 122b of the second area A2 by the polymer that is relatively hydrophilic so that the polymer that is relatively hydrophobic may be arranged in a same direction as the chemical pattern 122a.

Furthermore, a coupling is induced on the neutral pattern 122b of the first area A1 by the first and second nano-blocks NB1 and NB2 formed on the chemical pattern 122a and the neutral pattern 122b. Thus, the first and second nano-blocks NB1 and NB2 are arranged toward a center of the first area A1 from an edged of the first area A1.

According to the embodiment, PMMA is relatively hydrophilic with compared to PS. Thus, PMMA is disposed on the chemical pattern 122a to form the first nano-block NB1. PS is disposed on the neutral pattern 122b to form the second nano-block NB2.

After lapse of a predetermined time, the first and second nano-blocks NB1 and NB2 are formed so that the first nano-structure NS1 is formed on a substantially entire surface of the base substrate 110.

According to the embodiment, the sacrifice structure 144 is formed by using the photoresist pattern 132 and the first block copolymer, and the chemical pattern 122a is formed by using the photoresist pattern 132 and the sacrifice structure 144. Thus, the second block copolymer is uniformly arranged on the base substrate 110 having a large size, and the first nano-structure NS1 may be easily formed.

Method of Manufacturing a Pattern

Figure 4A:
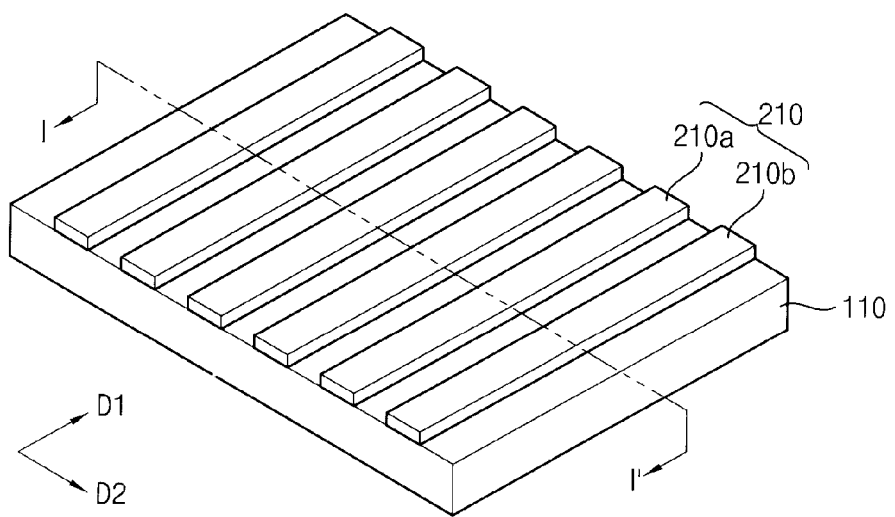
FIG. 4A is a perspective view illustrating a pattern formed by using the nano-structure illustrated in FIG. 2.

FIG. 4A is a perspective view illustrating a pattern formed by using the nano-structure illustrated in FIG. 2.

Figure 4B:
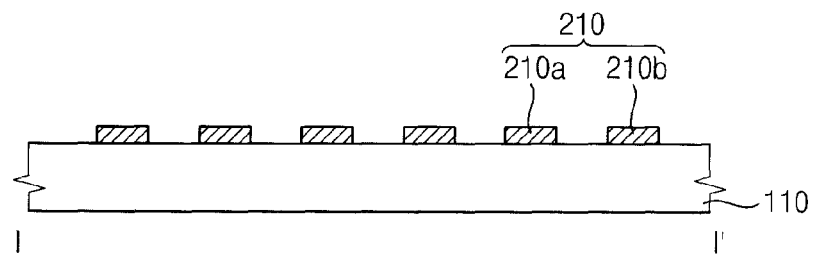
FIG. 4B is a cross-sectional view taken along the line I-I' of FIG. 4A.

FIG. 4B is a cross-sectional view taken along the line I-I' of FIG. 4A.

Referring FIGS. 4A and 4B, a pattern is a metal pattern forming a first polarization plate PL1, and includes a linear grid pattern 210 including a first line 210a and a second line 210b, which are formed on a base substrate 110.

The first and second lines 210a and 210b extend in a first direction D1 on the base substrate 110. The second line 210b is disposed spaced apart from the first line 210a along a second direction D2. The first and second lines 210a and 210b may be formed through patterning a metal layer. The metal layer may include aluminum, silver, platinum and the like.

Figure 5A:
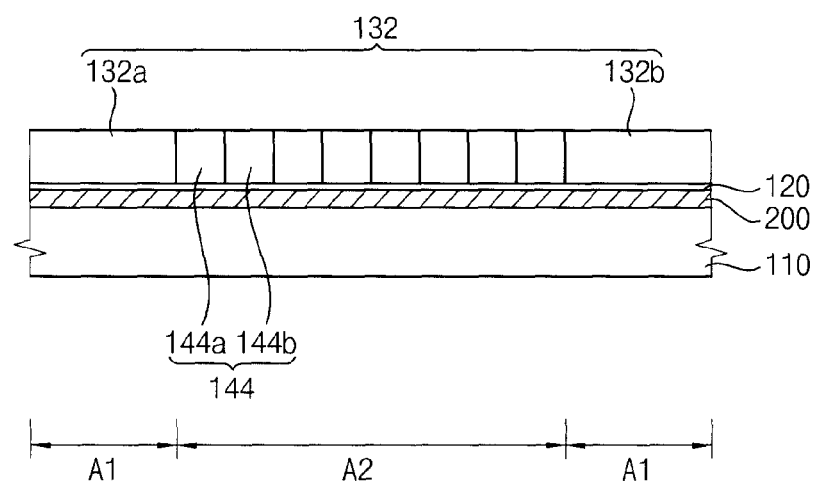
FIGS. 5A, 5B and 5C are cross-sectional views illustrating a method of manufacturing the illustrated pattern.
Figure 5B:
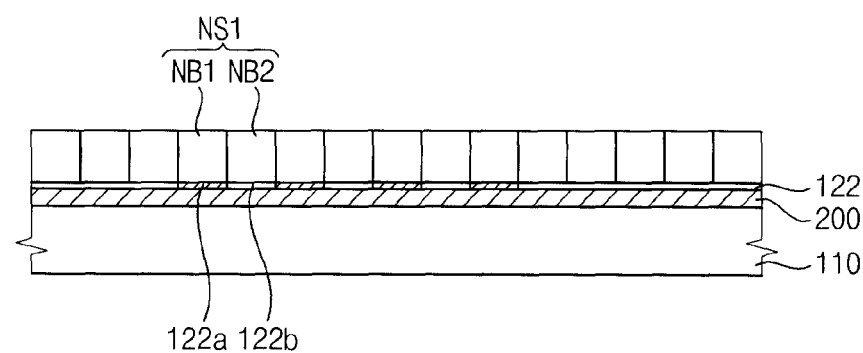
Figure 5C:
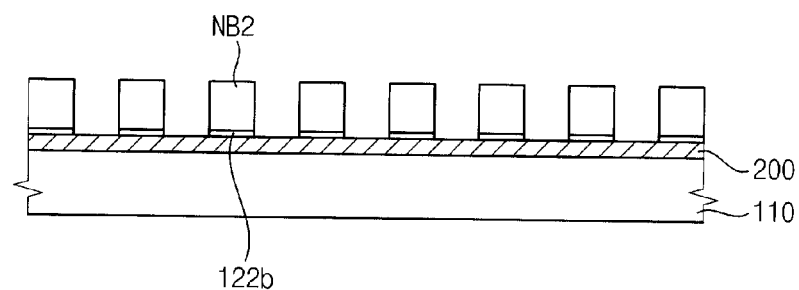

FIGS. 5A, 5B and 5C are cross-sectional views illustrating a method of manufacturing the illustrated pattern.

Referring to FIG. 5A, a metal layer 200 as a mother thin layer is formed on the base substrate 110. For, example, the metal layer 200 may include aluminum.

A neutral layer 120 and a photoresist pattern 132 are sequentially formed on the base substrate 110 having the metal layer 200. The photoresist pattern 132 includes a first partition portion 132a and a second partition portion 132b, which are formed on a first area A1 of the base substrate 110. The neutral layer 120 on a second area A2 is exposed through a gap between the first and second partition portions 132a and 132b. The method of forming the photoresist pattern 132 may be substantially the same as the methods explained with reference to FIG. 3B.

A sacrifice pattern 144 is formed on the base substrate 110 having the photoresist pattern 132. The sacrifice pattern 144 may be formed through the method explained with reference to FIGS. 3C and 3D. Thus, an explanation duplicating the method may be omitted.

Thereafter, a first sacrifice block 144a of the sacrifice pattern 144 is removed. Thereafter, the neutral layer 120 is oxidized using the photoresist pattern 132 and a second sacrifice block 144b as a mask.

Referring to FIG. 5B, a portion of the neutral layer 120 is oxidized to form a chemical pattern layer 122, and the second sacrifice block 144b and the photoresist pattern 132 on the chemical pattern layer 122 are removed. The chemical pattern layer 122 is substantially the same as the chemical pattern layer illustrated in FIG. 3B. Thus, the repeated explanation may be omitted.

Thereafter, a thin film including a block copolymer is formed on the base substrate 110 having the chemical pattern layer 122, and is heated to form a first nano-structure NS1 including a first nano-block NB1 and a second nano-block NB2. The first nano-structure NS1 is substantially the same as the nano-structure illustrated in FIG. 2. Thus, the repeated explanation may be omitted.

Referring to FIG. 5C, the first nano-block NB1 and a chemical pattern 122a of the chemical pattern layer 122, which is disposed under first nano-block NB1, are removed. Thus, the second nano-block NB2 and a neutral pattern 122b of the chemical pattern layer 122 remain on the metal layer 200.

An exposed portion of the metal layer 200 is etched using the second nano-block NB2 as a mask to form the linear grid pattern 210. Thereafter, the second nano-block NB2 and the neutral pattern 122b are removed.

According to the embodiment, the first nano-structure NS1 is formed by using a block copolymer. The metal layer 200 is patterned using the first nano-structure NS1 to form the linear grid pattern 210. Thus, the linear grid pattern 210 having a nano-size may be formed on the base substrate 110 having a large size, and reliability and productivity for manufacturing the first polarization plate PL1 may be improved.

Embodiment 2
Nano-Structure

Figure 6:
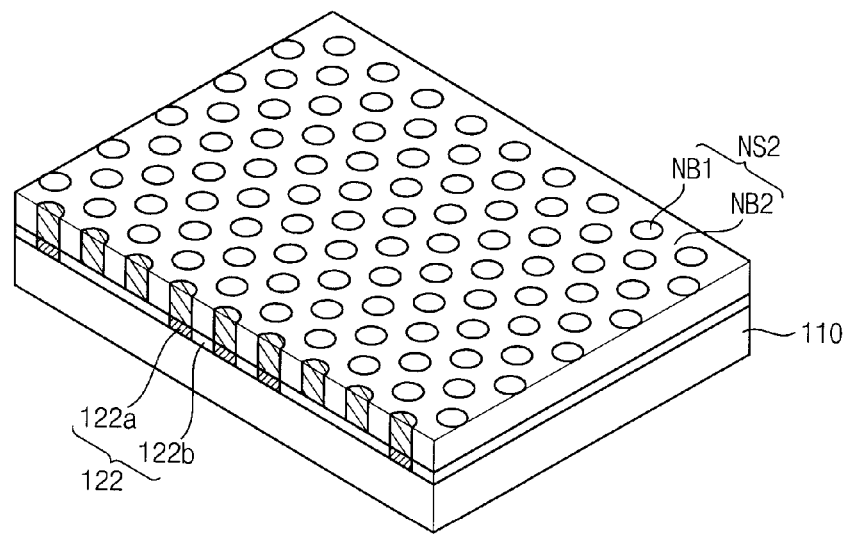
FIG. 6 is a perspective view illustrating a nano-structure manufactured according to an example embodiment of the present invention.

FIG. 6 is a perspective view illustrating a nano-structure manufactured according to an example embodiment of the present invention.

Referring to FIG. 6, a second nano-structure NS2 includes a first nano-block NB1 and a second nano-block NB2. The second nano-structure NS2 may further include a chemical pattern layer 122. The second nano-structure NS2 of the embodiment may have a cylindrical shape as illustrated in FIG. 1B.

The first nano-block NB1 has a cylindrical shape having a bottom surface contacting the chemical pattern layer 122. The second nano-block NB2 is disposed between adjacent first nano-blocks NB1 to surround the first nano-block NB1. The first nano-block NB1 includes PMMA, and the second nano-block NB2 includes PS. In a different aspect, the second nano-block NB2 may be a substrate surrounding the first nano-block NB1.

The chemical pattern layer 122 is substantially the same as the chemical pattern layer illustrated in FIG. 2. Thus, the repeated explanation may be omitted.

Method of Manufacturing a Nano-Structure

Figure 7A:
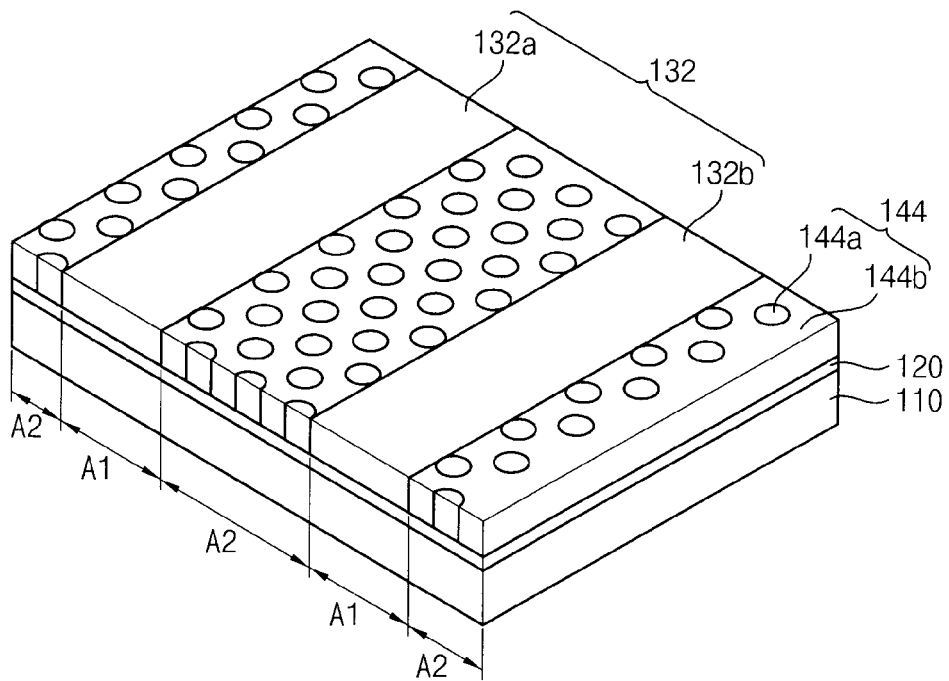
FIG. 7A is a perspective view illustrating a method of manufacturing the nano-structure illustrated in FIG. 6.

FIG. 7A is a perspective view illustrating a method of manufacturing the nano-structure illustrated in FIG. 6.

Referring to FIG. 7A, a neutral layer 120 and a photoresist pattern 132 are sequentially formed on a base substrate 110. The photoresist pattern 132 includes a first partition portion 132a and a second partition portion 132b. The neutral layer 120 and the photoresist pattern 132 are substantially the same as the neutral layer and the photoresist pattern explained with reference to FIGS. 3A and 3B. Thus, the repeated explanation may be omitted.

Thereafter, a thin film including a block copolymer is formed on the base substrate 110 having the photoresist pattern 132. The thin film includes PS-b-PMMA, and a ratio of PS and PMMA may be about 65:35 to about 60:40. Alternatively, the ratio of PS and PMMA may be about 35:65 to about 40:60.

The base substrate 110 with the thin film is heated to form a sacrifice structure 144. The sacrifice structure 144 includes a first sacrifice block 144a and a second sacrifice block 144b. The first sacrifice block 144a has a cylindrical shape as the first nano-block NB1.

Thereafter, the first sacrifice block 144a is removed from the sacrifice structure 144, and the neutral layer 120 is oxidized by using the photoresist pattern 132 and the second sacrifice block 144b as a mask to form a chemical pattern 122.

The second sacrifice block 144b and the photoresist pattern 132 are removed, and a thin film including the block copolymer is formed on the chemical pattern 122. The thin film is heated. Thus, the second nano-structure NS2 having a large size, which is illustrated in FIG. 6, may be easily formed on the base substrate 110.

Method of Manufacturing a Pattern

Figure 7B:
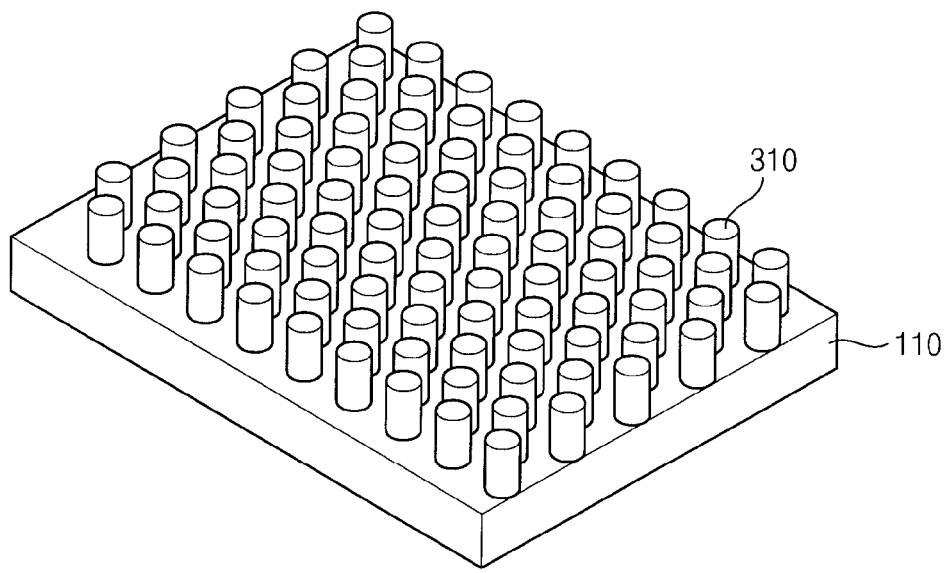
FIG. 7B is a perspective view illustrating a pattern formed by using the nano-structure illustrated in FIG. 7A.

FIG. 7B is a perspective view illustrating a pattern formed by using the nano-structure illustrated in FIG. 7A.

Referring to 7B, a pattern 310 is formed on the base substrate 110. The pattern 310 has a cylindrical shape substantially the same as the first nano-block NB1 of the second nano-structure NS2.

Figure 7C:
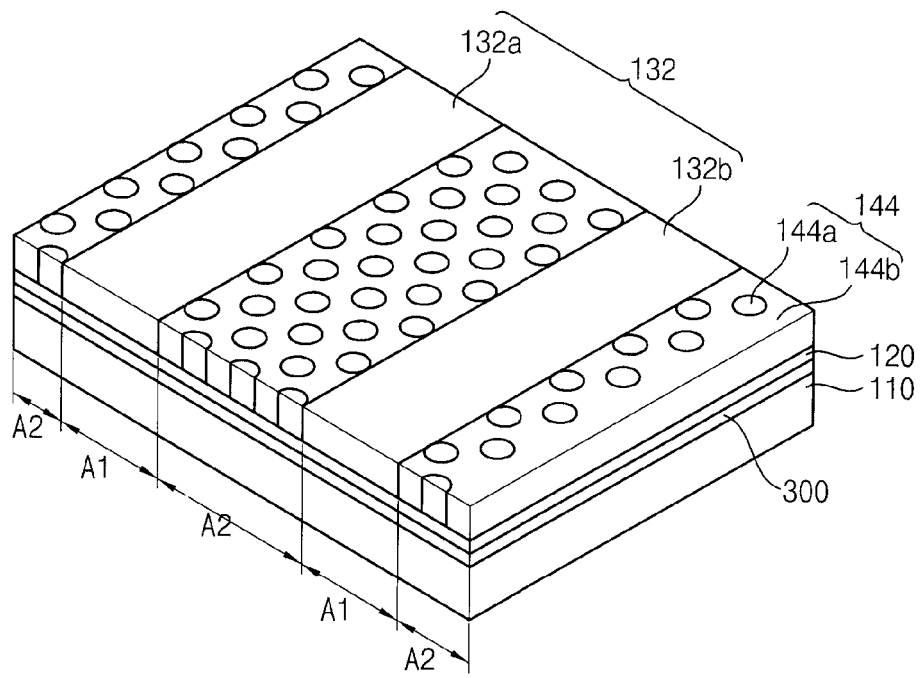
FIG. 7C is a perspective view illustrating a method of manufacturing the pattern illustrated in FIG. 7B.

FIG. 7C is a perspective view illustrating a method of manufacturing the pattern illustrated in FIG. 7B.

Referring to FIG. 7C, an organic layer 300 as a mother thin film is formed on the base substrate 110, and the second nano-structure NS2 is formed on the organic layer 300. A method of forming the second nano-structure NS2 is substantially the same as the method of forming the second nano-structure illustrated in FIG. 6. Thus, an explanation duplicating the method may be omitted.

The first nano-block NB1 is selectively removed from the second nano-structure NS2, and the organic layer 300 is patterned by using the second nano-block NB2 as a mask. Thus, the pattern 310 is formed on the base substrate 110.

According to the embodiment, the pattern 310 having a nano-size may be formed on the base substrate 110 having a large size.

Embodiment 3
Nano-Structure

Figure 8:
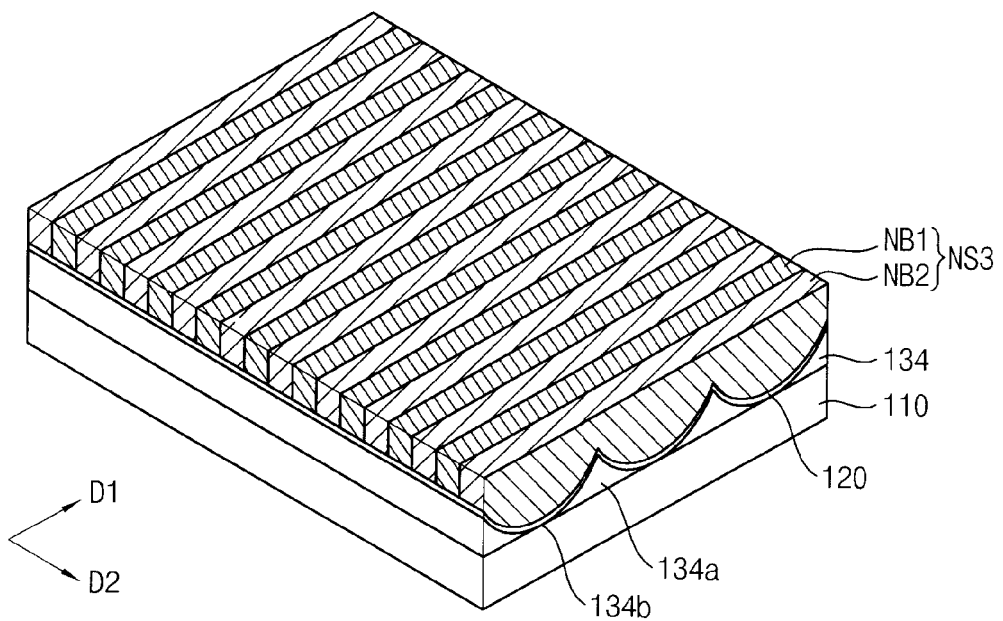
FIG. 8 is a perspective view illustrating a nano-structure manufactured according to an example embodiment of the present invention.

FIG. 8 is a perspective view illustrating a nano-structure manufactured according to an example embodiment of the present invention.

Referring to FIG. 8, a third nano-structure NS3 includes a first nano-block NB1 and a second nano-block NB2. The third nano-structure NS3 may further include a photoresist pattern 134 and a neutral layer 120, which are sequentially formed on a base substrate 110. The neutral layer 120 is substantially the same as the neutral layer illustrated in FIG. 3A. Thus, the repeated explanation may be omitted.

The first and second nano-blocks NB1 and NB2 extend in a first direction D1 on the base substrate 110, and are repeatedly arranged in a second direction D2 different from the first direction D1. The second direction D2 may be substantially perpendicular to the first direction D1. The third nano-structure NS3 may be substantially the same as the first nano-structure NS1 illustrated in FIG. 2 except that the third nano-structure NS3 is formed on the photoresist pattern 134. Thus, the repeated explanation may be omitted.

The photoresist pattern 134 includes a convex portion 134a and a concave portion 134b. The convex portion 134a and the concave portion 134b are repeatedly arranged in the first direction D1, and extend in the second direction D2. The concave portion 134b has a predetermined curvature, and may have a half-pipe shape. A gap between adjacent convex portions 134a may be about 1 μm to about 100 μm. A tangent line of the concave portion 134b may form about 3° to about 90° with respect to a surface of the base substrate 110.

Method of Manufacturing a Nano-Structure

Figure 9A:
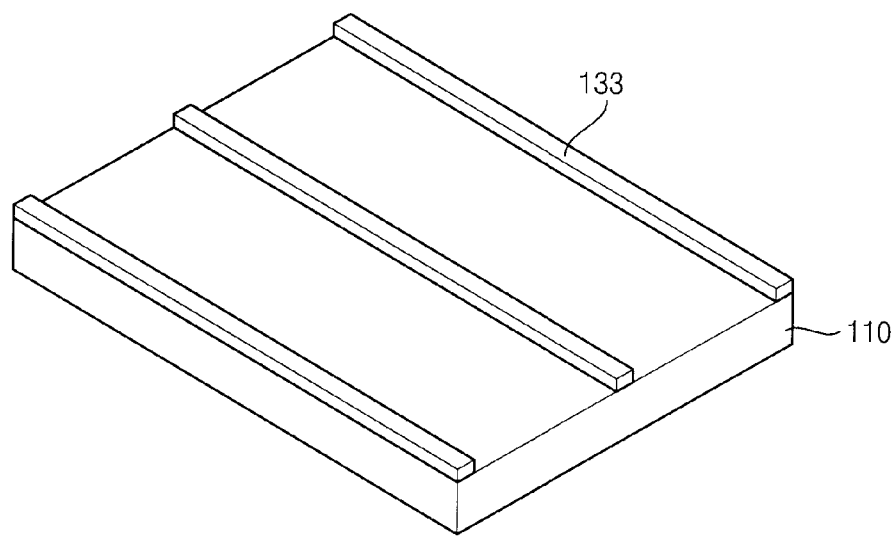
FIGS. 9A, 9B and 9C are perspective views illustrating a method of manufacturing the nano-structure illustrated in FIG. 8.
Figure 9B:
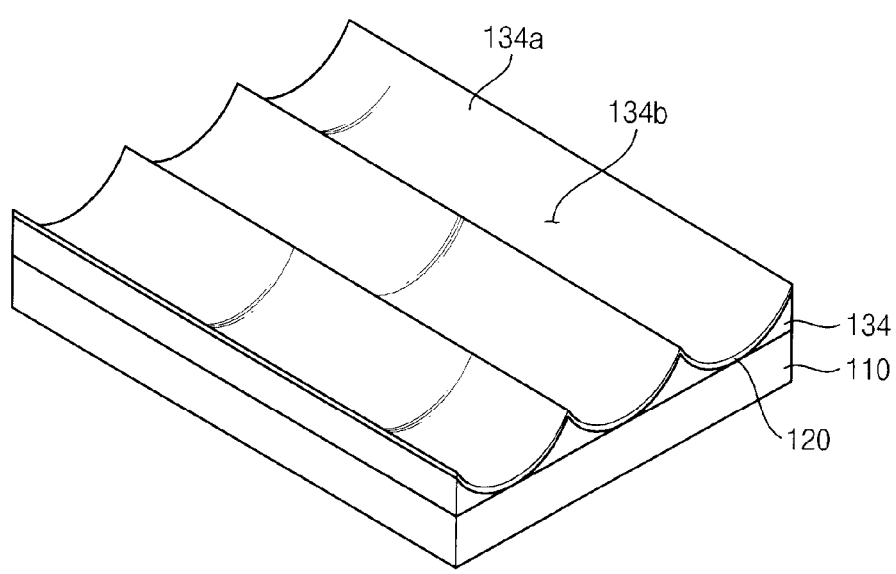
Figure 9C:
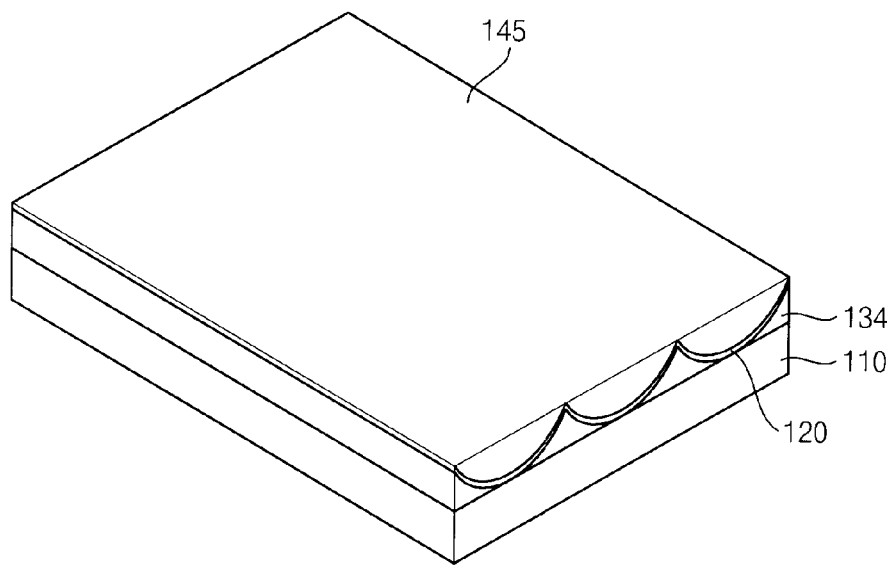

FIGS. 9A, 9B and 9C are perspective views illustrating a method of manufacturing the nano-structure illustrated in FIG. 8.

Referring to FIG. 9A, supporting patterns 133 are formed on a base substrate 110. The supporting patterns 133 extend in the second direction D2, and are spaced apart from each other in the first direction D1. The supporting patterns 133 may have a column shape. The supporting patterns 133 are formed in an area corresponding to the convex portion 134a of the photoresist pattern 134.

Referring to FIG. 9B, a photoresist composition is coated on the base substrate 110 having the supporting patterns 133 so that the convex portion 134a is formed where the supporting patterns 133 are formed. Furthermore, the concave portion 134b is formed between adjacent convex portions 134a by the photoresist composition. Thus, the photoresist pattern 134 is formed on the base substrate 110.

Although not shown, alternatively, the photoresist pattern 134 may be formed using a half-tone mask. For example, a photoresist composition may be coated on the base substrate 110 to form a photoresist film having a predetermined thickness. The half-tone mask is disposed on the base substrate 110 having the photoresist film. The photoresist film may be formed from a negative-type photoresist composition. The half-tone mask includes a light-blocking portion corresponding to the convex portion 134a and a half-tone portion corresponding to the concave portion 134b. A light is irradiated onto the photoresist film through the half-tone mask. Thereafter, the photoresist film is developed to form the photoresist pattern 134.

Alternatively, the photoresist pattern 134 may be formed using a slit mask having a half-tone portion including a plurality of slits.

Referring to FIG. 9C, the neutral layer 120 is formed on the base substrate 110 having the photoresist pattern 134. A thin film 145 including a block copolymer is formed on the base substrate 110 having the neutral layer 120. The block copolymer may include PS-b-PMMA having a lamella shape.

Thereafter, the base substrate 110 having the thin film 145 is heated to form the third nano-structure NS3. The first and second nano-blocks NB1 and NB2 are arranged depending on extinction ratio difference of defects due to a thickness of the thin film 145. Since the block copolymer is vertically orientated by the neutral layer 120 at an interface of the neutral layer 120 and the thin film 145, a shape of defects appearing at the interface passes through an entire thickness of the thin film 145. Thus, defect energy increases as a thickness of the thin film 145 increases. Furthermore, the defect energy induces extinction ratio gradient of defects depending on thickness gradient. As a result, the first and second nano-blocks NB1 and NB2 are formed at a portion of the thin film 145, which is relatively thick, for example, at a center of the concave portion 134b, and propagate depending on the thickness gradient. Furthermore, the block copolymer diffuses in the second direction D2 so that PS and PMMA are phase-separated from each other. Particularly, when a domain grows toward the convex portion 134a from the center of the concave portion 134b, the domain is phase-separated to form the first and second nano-blocks NB1 and NB2. The method of forming the first and second nano-blocks NB1 and NB2 is particularly described by Korean Patent Applications No. 10-2007-0066688 (Korean Publication Applications No. 10-2009-0001371) that is assigned to the assignee of the application and Korea Advanced Institute of Science and Technology.

As a result, the third nano-structure NS3 may be formed.

According to the embodiment, the third nano-structure NS3 may be easily formed by using the photoresist pattern 134 without the sacrifice structure 144 and an oxidization of the neutral layer 120, which are illustrated in FIG. 3D. Furthermore, thickness gradient of the thin film 145 may be provided by the photoresist pattern 134 instead of an imprinting method. Thus, problems such as damage to an imprinter, reliability deterioration due to impurities in an imprinting process, etc., may be prevented.

Method of Manufacturing a Pattern

A pattern manufactured according to the embodiment is substantially the same as the pattern illustrated in FIGS. 4A and 4B. Thus, the repeated explanation may be omitted.

Figure 9D:
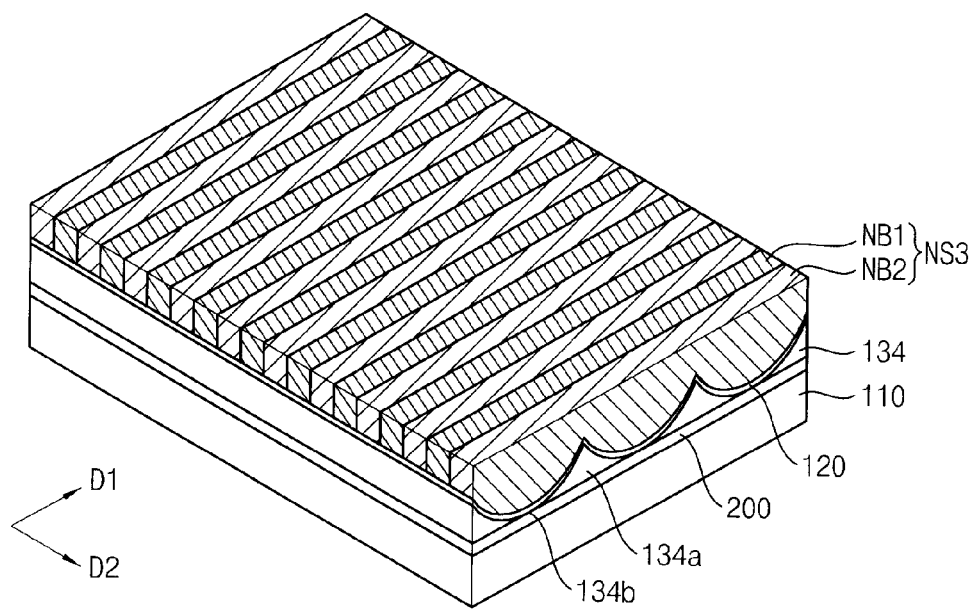
FIG. 9D is a perspective view illustrating a method of manufacturing a pattern by using the nano-structure illustrated in FIG. 8.

FIG. 9D is a perspective view illustrating a method of manufacturing a pattern by using the nano-structure illustrated in FIG. 8.

Referring to FIG. 9D, a metal layer 200 is formed as a mother thin film on the base substrate 110, and the third nano-structure NS3 is formed on the metal layer 200. The method of forming the third nano-structure NS3 is substantially the same as the method illustrated in FIGS. 9A to 9C. Thus, an explanation duplicating the method may be omitted.

The first nano-block NB1 is selectively removed from the third nano-structure NS3, and the photoresist pattern 134, the neutral layer 120 and the metal layer 200 are patterned using the second nano-block NB2 as a mask. Accordingly, the linear grid pattern 210 is formed on the base substrate 110. After the linear grid pattern 210 is formed, the photoresist pattern 134 and the neutral layer 120 are removed.

According to the embodiment, the linear grid pattern 210 having a nano-size may be formed on the base substrate 110 having a large size.

Embodiment 4

Nano-Structure and Method of Manufacturing the Nano-Structure

A nano-structure according to the embodiment is substantially the same as the third nano-structure NS3 illustrated in FIG. 8, and a method of manufacturing the nano-structure is substantially the same as the method of manufacturing the third nano-structure NS3 illustrated in FIGS. 9A to 9C. Thus, the repeated explanations may be omitted.

Method of Manufacturing a Pattern

Figure 10:
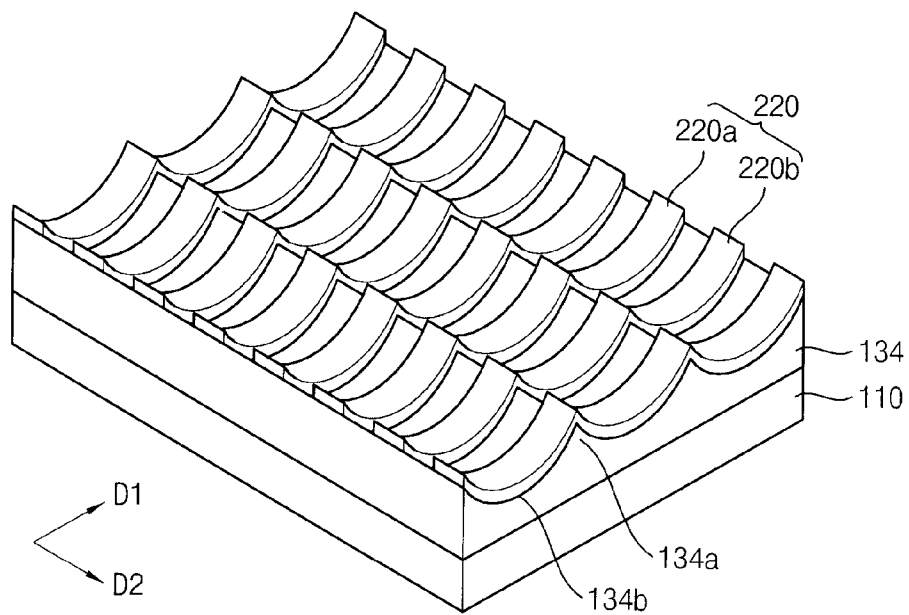
FIG. 10 is a perspective view illustrating a pattern manufactured according to an example embodiment of the present invention.

FIG. 10 is a perspective view illustrating a pattern manufactured according to an example embodiment of the present invention.

A pattern illustrated in FIG. 10 is a metal pattern included in a second polarization plate PL2, and includes a linear grid pattern 220 including a first line 220a and a second line 220b, which are formed on the base substrate 110.

The second polarization plate PL2 may further include a photoresist pattern 134 formed under the linear grid pattern 220. The photoresist pattern 134 includes a convex portion 134a and a concave portion 134b. The convex portion 134a and the concave portion 134b are arranged in the first direction D1, and extend in a second direction D2 different from the first direction D1. The concave portion 134b has a predetermined curvature, and may have a half-pipe shape.

The linear grid pattern 220 is formed on the photoresist pattern 134. The linear grid pattern 220 includes a first line 220a and a second line 220b, which extend in the first direction D1 on the base substrate 110. The first and second lines 220a and 220b are disposed adjacent to each other in the second direction D2. The linear grid pattern 220 is formed along a convex-concave structure formed by the convex portion 134a and the concave portion 134b.

An overcoating layer may be further formed on the base substrate 110 having the linear grid pattern 220 to planarize and protect the second polarization plate PL2.

Figure 11:
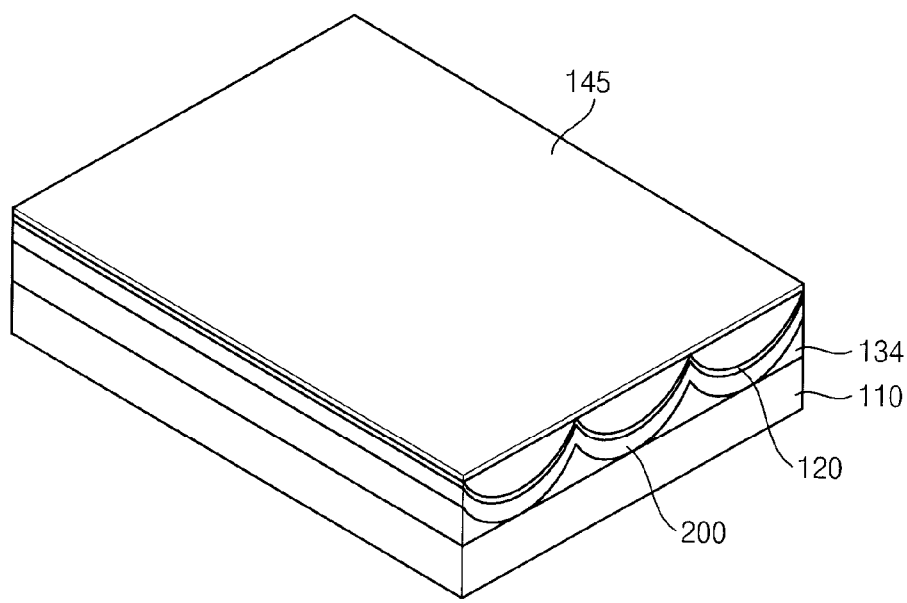
FIG. 11 is a perspective view illustrating a method of manufacturing the pattern illustrated in FIG. 10.

FIG. 11 is a perspective view illustrating a method of manufacturing the pattern illustrated in FIG. 10.

Referring to FIG. 11, the photoresist pattern 134 is formed on the base substrate 110. The photoresist pattern 134 may be formed through the same method as the photoresist pattern illustrated in FIGS. 9A and 9B. Thus, an explanation duplicating the method may be omitted.

A metal layer 200 is formed on the base substrate 110 having the photoresist pattern 134. A neutral layer 120 is formed on the metal layer 200. The neutral layer 120 is substantially the same as the neutral layer illustrated in FIG. 3A. Thus, the repeated explanation may be omitted.

A thin film 145 including a block copolymer is formed on the base substrate 110 having the neutral layer 120. The block copolymer may include PS-b-PMMA having a lamella shape. The thin film 145 is heated to form a nano-structure. The nano-structure is substantially the same as the third nano-structure NS3 illustrated in FIG. 8, and may be formed through substantially the same method of manufacturing the nano-structure NS3. Thus, the repeated explanations may be omitted.

Thereafter, the first nano-block NB1 of the third nano-structure NS3 is removed so that the second nano-block NB2 remains on the metal layer 200. The metal layer is etched by using the second nano-block NB2 as a mask to form the linear grid pattern 220. As a result, the second polarization plate PL2 including the photoresist pattern 134 and the linear grid pattern 220 formed on the base substrate 110 is manufactured.

According to the embodiment, the third nano-structure NS3 may be easily formed by using the photoresist pattern 134 without the sacrifice structure 144 and an oxidization of the neutral layer 120, which are illustrated in FIG. 3D. Thus, the linear grid pattern 220 having a nano-size may be formed on the base substrate 110 having a large size.

Embodiment 5

Nano-Structure and Method of Manufacturing the Nano-Structure

A nano-structure according to the embodiment is substantially the same as the third nano-structure NS3 illustrated in FIG. 8, and a method of manufacturing the nano-structure is substantially the same as the method of manufacturing the third nano-structure NS3 illustrated in FIGS. 9A to 9C. Thus, the repeated explanations may be omitted.

Method of Manufacturing a Pattern

Figure 12A:
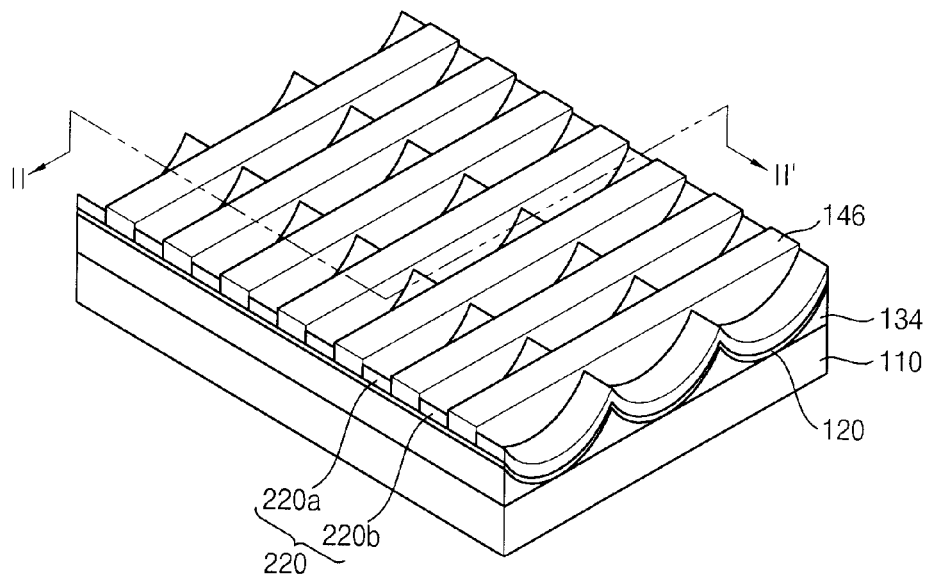
FIG. 12A is a perspective view illustrating a pattern manufactured according to an example embodiment of the present invention.

FIG. 12A is a perspective view illustrating a pattern manufactured according to an example embodiment of the present invention.

Figure 12B:
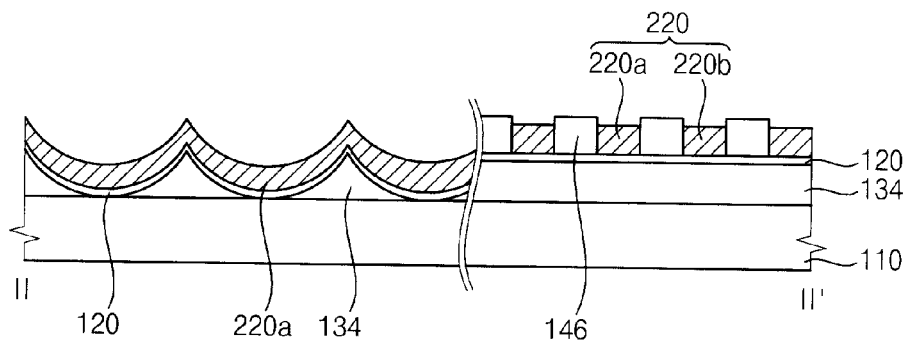
FIG. 12B is a cross-sectional view taken along a line II-II' of FIG. 12A.

FIG. 12B is a cross-sectional view taken along a line II-II' of FIG. 12A.

A pattern illustrated in FIGS. 12A and 12B is a metal pattern included in a third polarization plate PL3, and includes a linear grid pattern 220 including a first line 220a and a second line 220b, which are formed on the base substrate 110. The third polarization plate PL3 may further include a photoresist pattern 134, a neutral layer 120 and a remaining block 146. The third polarization plate PL3 is substantially the same as the second polarization plate PL2 illustrated in FIG. 10 except for the neutral layer 120 and the remaining block 146. Thus, the repeated explanation may be omitted.

The neutral layer 120 is formed on the base substrate 110 having the photoresist pattern 134. The neutral layer 120 is substantially the same as the neutral layer illustrated in FIG. 3A. Thus, the repeated explanation may be omitted.

The remaining block 146 is a remaining portion of a nano-structure in a process of forming the linear grid pattern 220. For example, the remaining block 146 may include PS. The remaining block 146 is formed between the first line 220a and the second line 220b, which are disposed adjacent to each other.

Figure 13A:
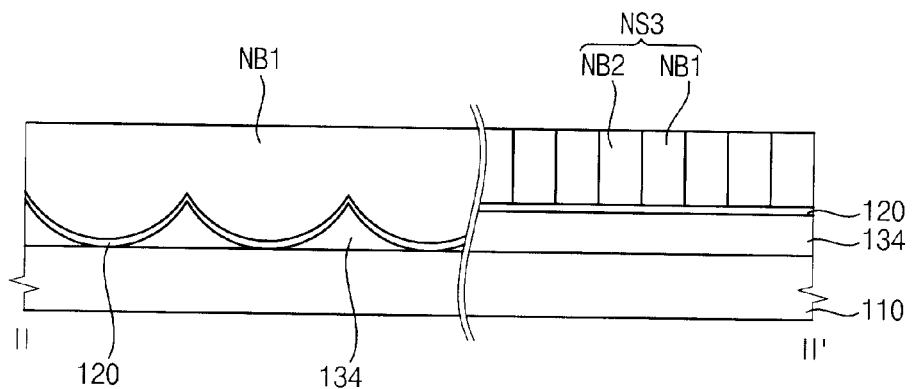
FIGS. 13A and 13B are cross-sectional views illustrating a method of manufacturing the pattern illustrated in FIG. 12B.
Figure 13B:
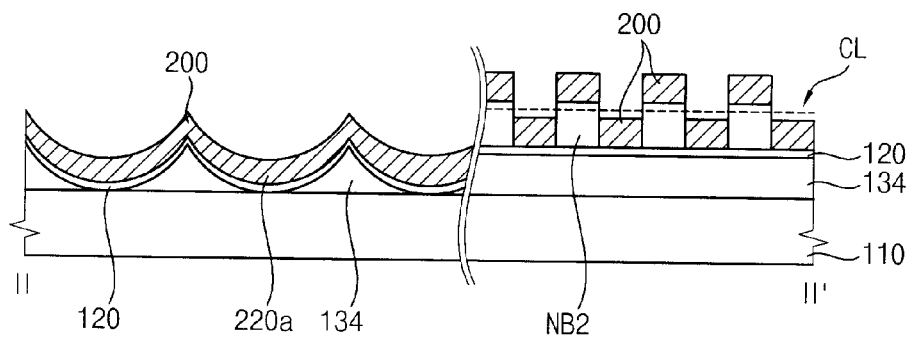

FIGS. 13A and 13B are cross-sectional views illustrating a method of manufacturing the pattern illustrated in FIG. 12B.

Referring to FIG. 13A, the photoresist pattern 134 is formed on the base substrate 110. A neutral layer 120 is formed on the base substrate 110 having the photoresist pattern. A third nano-structure NS3 including a first nano-block NB1 and a second nano-block NB2 is formed on the base substrate 110 having the neutral layer 120. The third nano-structure NS3 is substantially the same as the nano-structure illustrated in FIG. 8, and a method of manufacturing the third nano-structure NS3 is substantially the same as the method of manufacturing the nano-structure, which is previously described. Thus, the repeated explanations may be omitted.

Referring to FIG. 13B, the first nano-block NB1 is removed from the third nano-structure NS3, and a metal layer 200 is formed on the base substrate 110 having the second nano-block NB2, the neutral layer 120 and the photoresist pattern 132. The metal layer 200 is formed on the second nano-block NB2 and on the neutral layer 120 exposed through a gap between adjacent second nano-blocks NB2.

Thereafter, a portion of the second nano-block NB2 is removed along a virtual cutting line CL intersecting an upper portion of the second nano-block NB2 so that the metal layer 200 formed on the second nano-block NB2 is removed. Thus, the metal layer 200 remains only on the metal layer 200 disposed between the second nano-blocks NB2 to form the linear grid pattern 220. The remaining block 146 of the third polarization plate PL3 is defined as the second nano-block NB2 remaining on the base substrate 110. A portion of the second nano-block NB2 may be removed through a dry-etching process.

Therefore, the third polarization plate PL3 may be manufactured.

Alternatively, the second polarization plate PL2 illustrated in FIG. 10 may be formed through the manufacturing method illustrated in FIG. 11 after removing the second nano-block NB2.

Embodiment 6

Nano-Structure and Method of Manufacturing the Nano-Structure

A nano-structure according to the embodiment is substantially the same as the third nano-structure NS3 illustrated in FIG. 8, and a method of manufacturing the nano-structure is substantially the same as the method of manufacturing the third nano-structure NS3 illustrated in FIGS. 9A to 9C. Thus, the repeated explanations may be omitted.

Method of Manufacturing a Pattern

Figure 14:
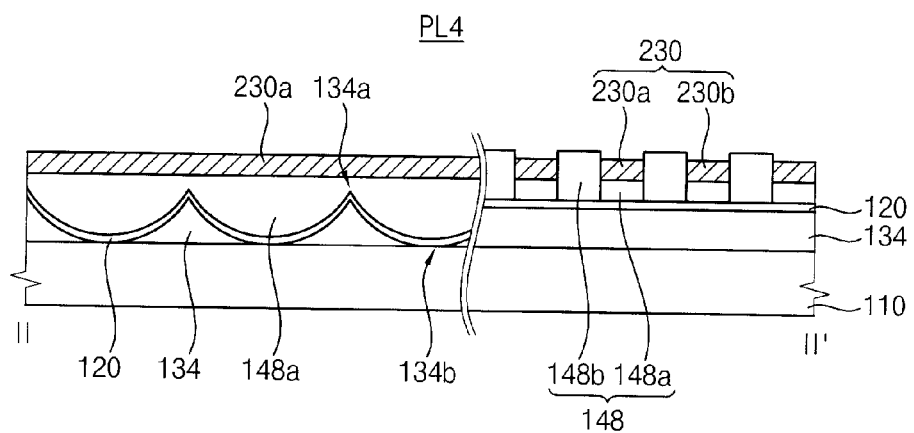
FIG. 14 is a cross-sectional view illustrating a pattern manufactured according to the embodiment.

FIG. 14 is a cross-sectional view illustrating a pattern manufactured according to the embodiment.

A pattern illustrated in FIG. 14 is a metal pattern included in a fourth polarization plate PL4, and includes a linear grid pattern 230 including a first line 230a and a second line 230b, which are formed on the base substrate 110. The fourth polarization plate PL4 may further include a photoresist pattern 134, a neutral layer 120 and a remaining structure 148. The fourth polarization plate PL4 is substantially the same as the second polarization plate PL2 illustrated in FIG. 4 except for the remaining structure 148. Thus, the repeated explanation may be omitted.

The remaining structure 148 includes a first remaining portion 148a formed under the linear grid pattern 230, and a second remaining portion 148b formed on the neutral layer 120. Thus, the linear grid pattern 230 is disposed on the first remaining portion 148a, and the second remaining portion 148b is disposed between the first and second lines 230a and 230b, which are spaced apart from each other.

A height of the first remaining portion 148a is less than a height of the second remaining portion 148b with respect to a virtual horizontal line connecting a convex portion 134a of the photoresist pattern 134. Heights of the first and second remaining portions 148a and 148b from a surface of the base substrate 110 may be substantially same. However, the second remaining portion 148b protrudes from the virtual horizontal line more than the first remaining portion 148a does. The first remaining portion 148a preferably has a thickness substantially the same as a distance from a surface of the base substrate 110 to the virtual horizontal line. Thus, the first remaining portion 148a fills a concave portion 134b so that the linear grid pattern 230 disposed on the concave portion 134b is disposed on a surface substantially parallel to the surface of the base substrate 110.

Figure 15A:
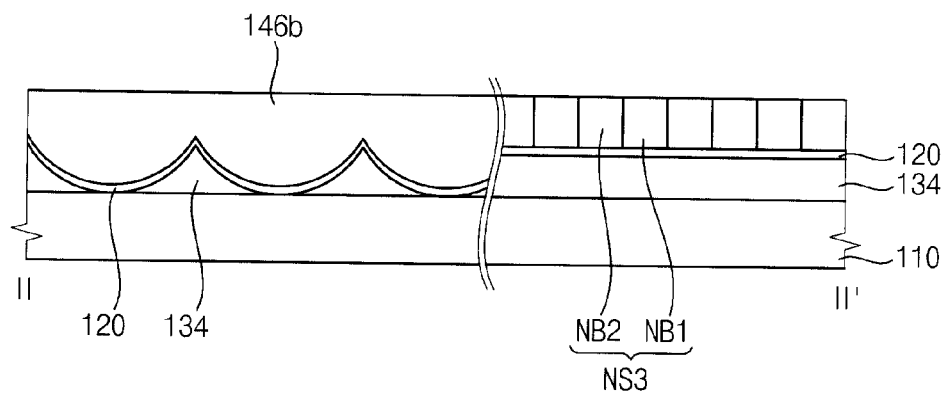
FIGS. 15A, 15B and 15C are cross-sectional views illustrating a method of manufacturing the pattern illustrated in FIG. 14.
Figure 15B:
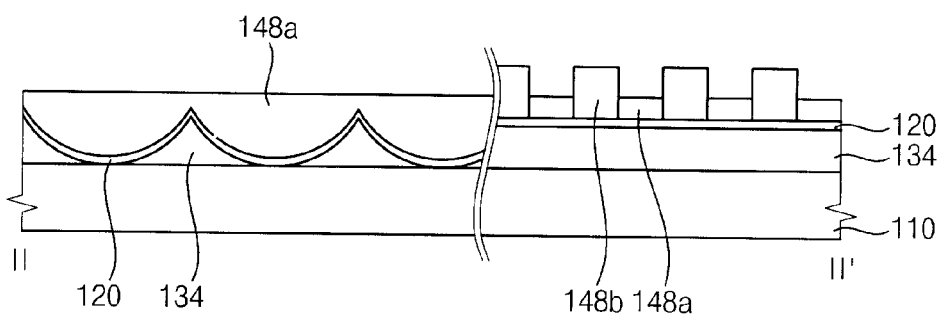
Figure 15C:
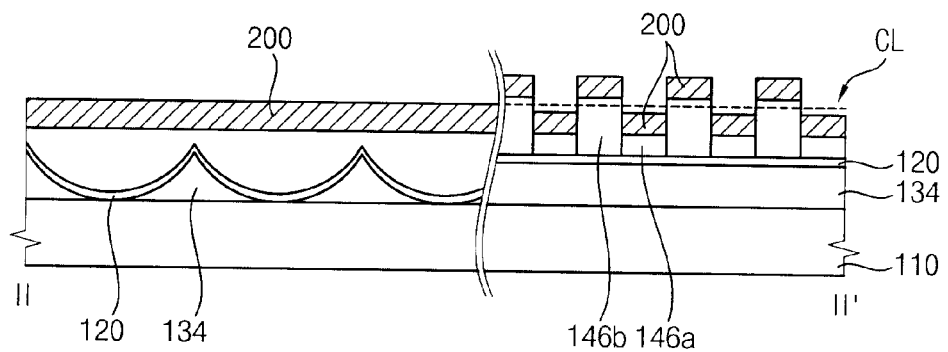

FIGS. 15A, 15B and 15C are cross-sectional views illustrating a method of manufacturing the pattern illustrated in FIG. 14.

Referring to FIG. 15A, the photoresist pattern 134, the neutral layer 120 and a third nano-structure NS3 are sequentially formed on the base substrate 110. The photoresist pattern 134, the neutral layer 120 and the third nano-structure NS3 may be formed through the method illustrated in the FIG. 13A. Thus, an explanation duplicating the method may be omitted.

Referring to FIG. 15B, a portion of a first nano-block NB1 is removed from the third nano-structure NS3 so that a thickness of the first remaining portion 148a is reduced thereby forming the first remaining portion 148a.

Referring to FIG. 15C, a metal layer 200 is formed on the base substrate 110 having the first remaining portion 148a and the second nano-block NB2. The metal layer 200 is disposed on the first remaining portion 148a and the second nano-block NB2.

Thereafter, a portion of the second nano-block NB2 is removed along a virtual cutting line CL intersecting an upper portion of the second nano-block NB2 so that the metal layer 200 formed on the second nano-block NB2 is removed. Therefore, the metal layer 200 remains only on the first remaining portion 148a so that the linear grid pattern 220 is formed. The second nano-block NB2 remaining on the base substrate 110 is defined as the second remaining portion 148b of the remaining structure 148. The portion of the second nano-block NB2 may be removed through a dry-etching process.

As a result, the fourth polarization plate PL4 according to the embodiment of the present invention is formed.

According to the embodiment, the third nano-structure NS3 may be easily formed by using the photoresist pattern 134 without the sacrifice structure 144 and an oxidization of the neutral layer 120, which are illustrated in FIG. 3D. Furthermore, the linear grid pattern 220 may be formed on a surface substantially parallel to the surface of the base substrate 110 since the remaining structure 148 is formed by using the third nano-structure NS3. Thus, deterioration of polarization reliability due to height difference of the photoresist pattern 134 may be prevented. Therefore, productivity and manufacturing reliability for the fourth polarization plate PL4 may be improved.

Embodiment 7
Nano-Structure

Figure 16:
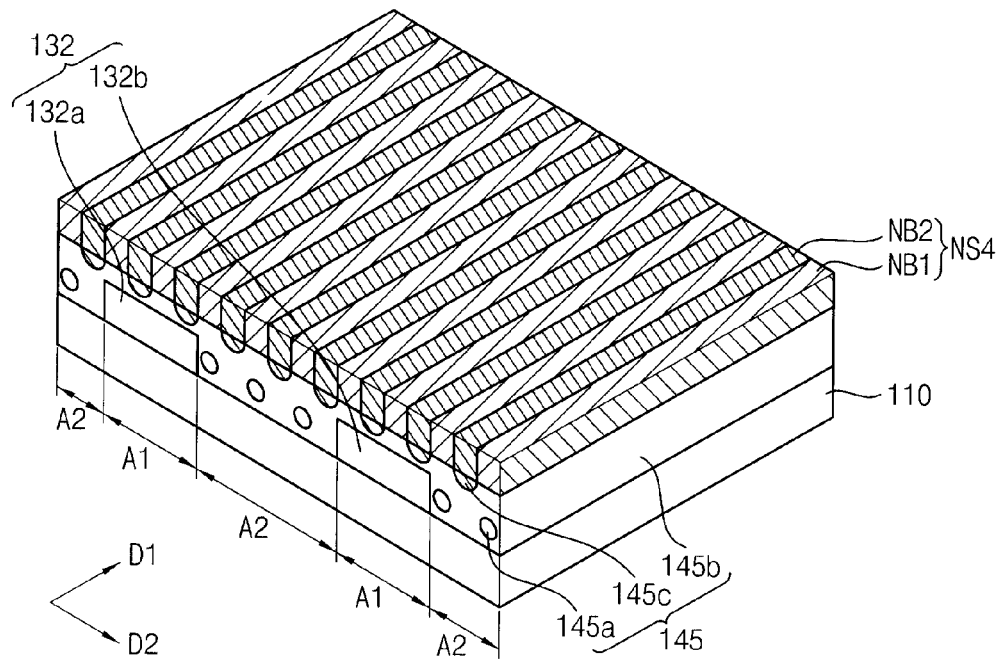
FIG. 16 is a perspective view illustrating a nano-structure manufactured according to an example embodiment of the present invention.

FIG. 16 is a perspective view illustrating a nano-structure manufactured according to an example embodiment of the present invention.

A fourth nano-structure NS4 illustrated in FIG. 16 includes a first nano-block NB1 and a second nano-block NB2. The fourth nano-structure NS4 may further include a buffer structure 145 and a photoresist pattern 132, which are formed on the base substrate 110.

The first and second nano-blocks NB1 and NB2 are substantially the same as the first and second nano-blocks illustrated in FIG. 2, except that the first and second nano-blocks NB1 and NB2 are formed on the buffer structure 145. Thus, the repeated explanation may be omitted.

The photoresist pattern 132 is formed between the buffer structure 145 and the base substrate 110. The photoresist pattern 132 is formed on a first area A1 of the base substrate 110 so that a second area A2 between adjacent first areas A1 is exposed.

The buffer structure 145 includes a plurality of nano-cylinders 145a, a plurality of half-cylinders 145c and a substrate 145b. The nano-cylinders 145a and the half-cylinders 145c extend in a first direction D1 on the base substrate 110, and are arranged parallel in a second direction D2 different from the first direction D1.

The nano-cylinders 145a are disposed on the second area A2. For example, the nano-cylinders 145a are disposed between a first partition portion 132a and a second partition portion 132b of the photoresist pattern 132, which are disposed adjacent to each other. The half-cylinders 145c are disposed on the base substrate 110 having the photoresist pattern 132 and the nano-cylinders 145a. The half-cylinders 145c have a shape like a half of the nano-cylinders 145a. The substrate 145b is disposed between the nano-cylinders 145a and the half-cylinders 145c so that the buffer structure 145 forms a continuous layer shape.

Method of Manufacturing a Nano-Structure

Figure 17:
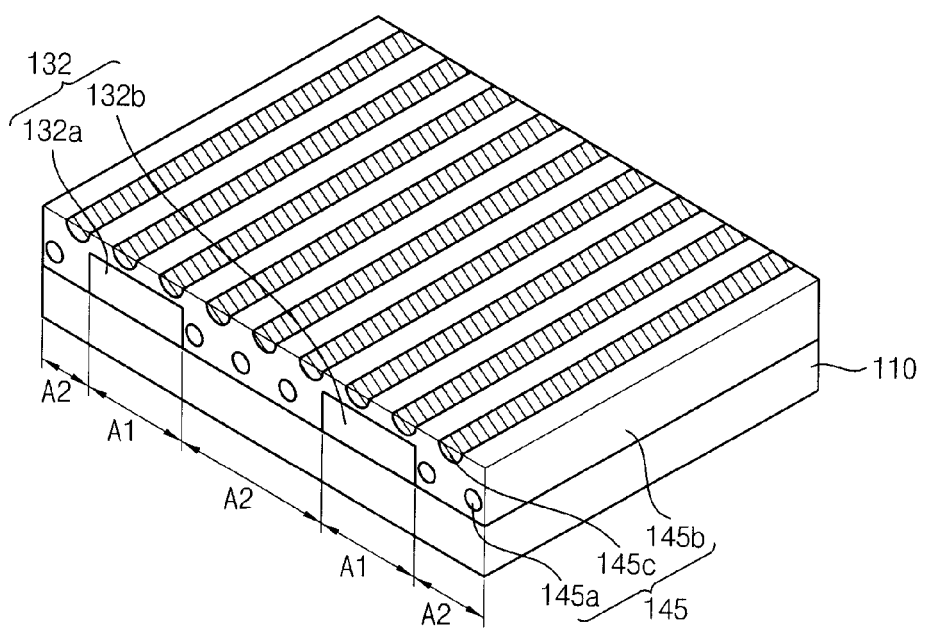
FIG. 17 is a cross-sectional view illustrating a method of manufacturing the nano-structure illustrated in FIG. 16.

FIG. 17 is a cross-sectional view illustrating a method of manufacturing the nano-structure illustrated in FIG. 16.

The photoresist pattern 132 is formed on the base substrate 110. The photoresist pattern 132 is formed on the first area A1. The photoresist pattern 132 may be formed through substantially the same method as the photoresist pattern illustrated in FIG. 3C except that the photoresist pattern 132 is formed directly on the base substrate 110. Thus, an explanation duplicating the method may be omitted.

A height of the photoresist pattern 132 may be preferably 150% of a distance between centers of adjacent nano-cylinders 145a. Therefore, the half-cylinders 145c may be disposed on the nano-cylinders 145a.

Thereafter, a buffer layer including a cylindrical block copolymer is formed on the base substrate 110 having the photoresist pattern 132. The buffer layer is heated to form the buffer structure 145. The cylindrical block copolymer includes PS-b-PMMA, and the nano-cylinder 145a and the half-cylinder 145c include PMMA, and the substrate 145b includes PS.

A thin film including a lamella-shaped block copolymer is formed on the base substrate 110 having the buffer structure 145. The thin film is heated to form the fourth nano-structure NS4 including the first and second nano-blocks NB1 and NB2. The first nano-block NB1 is formed on the substrate 145b, and the second nano-block NB2 is formed on the half-cylinder 145c.

As a result, the fourth nano-structure NS4 illustrated in FIG. 16 is formed.

According to the embodiment, the fourth nano-structure NS4 may be easily formed on the base substrate 110 by using the buffer structure 145 without forming a neutral layer or a chemical pattern layer. The cylindrical block copolymer has a superior mobility with compared to the lamella-shaped block copolymer. Thus, the fourth nano-structure NS4 may be formed in a short time when the thin film including the lamella-shaped block copolymer is formed in a short time after the buffer structure 145 is formed.

Method of Manufacturing a Pattern

A pattern according to an example embodiment of the present invention is substantially the same as the pattern illustrated in FIGS. 4A and 4B. Thus, the repeated explanation may be omitted.

Figure 18A:
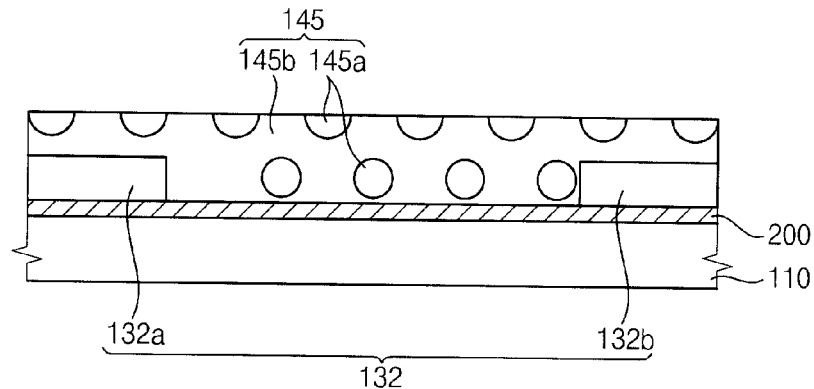
FIGS. 18A, 18B and 18C are cross-sectional views illustrating a method of manufacturing a pattern by using the nano-structure illustrated in FIG. 16.
Figure 18B:
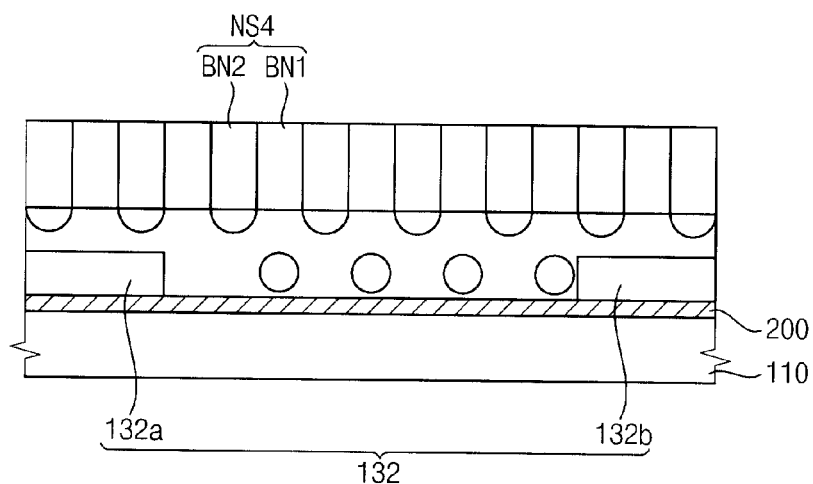
Figure 18C:
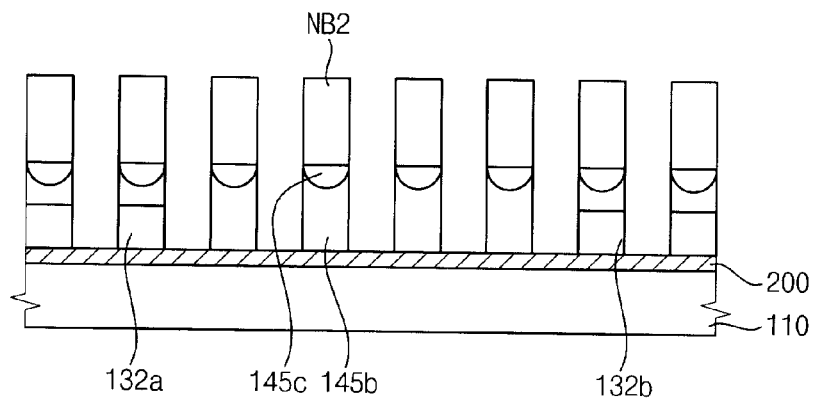

FIGS. 18A, 18B and 18C are cross-sectional views illustrating a method of manufacturing a pattern by using the nano-structure illustrated in FIG. 16.

Referring to FIG. 18A, a metal layer 200 is formed on the base substrate 110. A photoresist pattern 132 is formed on the metal layer 132. A buffer layer including a cylindrical block copolymer is formed on the base substrate 110 having the photoresist pattern 132. The buffer layer is heated to form the buffer structure 145. The buffer structure 145 is substantially the same as the buffer structure illustrated in FIG. 17. Thus, the repeated explanation may be omitted.

Referring to FIG. 18B, a fourth nano-structure NS4 is formed on the base substrate 110 having the buffer structure 145. The fourth nano-structure NS4 is substantially the same as the nano-structure illustrated in FIG. 16. Thus, the repeated explanation may be omitted.

Referring to FIG. 18C, a portion of the fourth nano-structure NS4 is removed. Particularly, a first nano-block NB1, a portion of a substrate 145b disposed under the fourth nano-block NB1, and a nano-cylinder 145a are removed. For example, the first nano-block NB1, the portion of the substrate 145b and the nano-cylinder 145a may be removed by oxygen plasma. Thus, a portion of the substrate 145b, the half-cylinder 145c and the second nano-block NB2 remains on the metal layer 200. A portion of the metal layer 200 is exposed through remaining fourth nano-structure NS4.

Thereafter, the metal layer 200 is etched by using the remaining fourth nano-structure NS4 as a mask to form the pattern illustrated in FIGS. 4A and 4B.

According to the embodiment, the fourth nano-structure NS4 may be easily formed on the base substrate 110 by using the buffer structure 145 without forming a neutral layer or a chemical pattern layer. Therefore, the fourth nano-structure NS4 may be easily formed on the base substrate 110 having a large size. Thus, productivity and manufacturing reliability for the first polarization plate PL1 may be improved.

Embodiment 8

Nano-Structure and Method of Manufacturing the Nano-Structure

A nano-structure according to the embodiment is substantially the same as the nano-structure illustrated in FIG. 16, except that the nano-structure does not include a photoresist pattern 132. Thus, the repeated explanation may be omitted.

Method of Manufacturing a Pattern

Figure 19A:
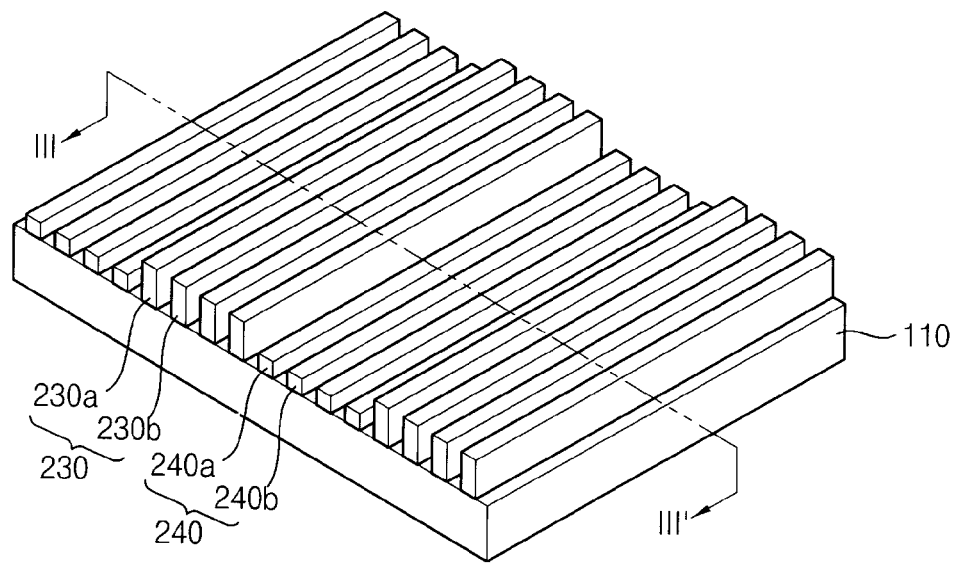
FIG. 19A is a perspective view illustrating a pattern manufactured according to an example embodiment of the present invention.

FIG. 19A is a perspective view illustrating a pattern manufactured according to an example embodiment of the present invention.

Figure 19B:
FIG. 19B is a cross-sectional view taken along a line of FIG. 19A.

FIG. 19B is a cross-sectional view taken along a line III-III' of FIG. 19A.

A pattern illustrated in FIGS. 19A and 19B is a metal pattern included in a fifth polarization plate PL5, and includes a first linear grid pattern 230 including a first line 230a and a second line 230b, and a second linear grid pattern 240 including a third line 240a and a fourth line 240b, which are formed on a base substrate 110. The first linear grid pattern 230 has a first thickness "a", and the second linear grid pattern 240 has a second thickness "b". The second thickness "b" is less than the first thickness "a".

FIGS. 20A, 20B, 20C and 20D are cross-sectional views illustrating the pattern illustrated in FIG. 19B.

Figure 20A:
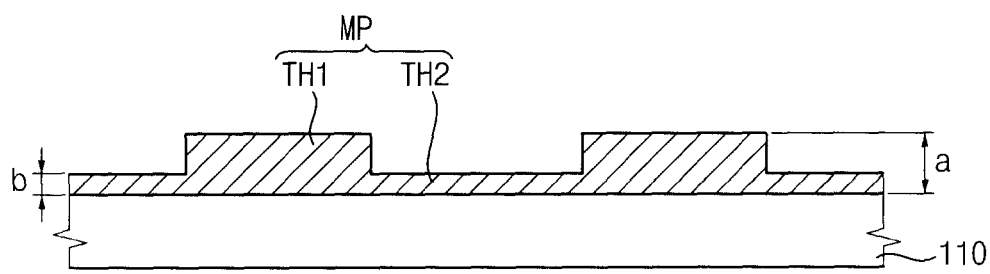
FIGS. 20A, 20B, 20C and 20D are cross-sectional views illustrating the pattern illustrated in FIG. 19B.

Referring to FIG. 20A, a metal pattern MP is formed on the base substrate 110. The metal pattern MP includes a first thickness portion TH1 having the first thickness "a" and a second thickness portion TH2 having the second thickness "b". For example, a metal layer and a photoresist pattern (not shown) may be formed on the base substrate, and the metal layer may be etched by using the photoresist pattern as a mask to form the metal pattern MP.

Figure 20B:
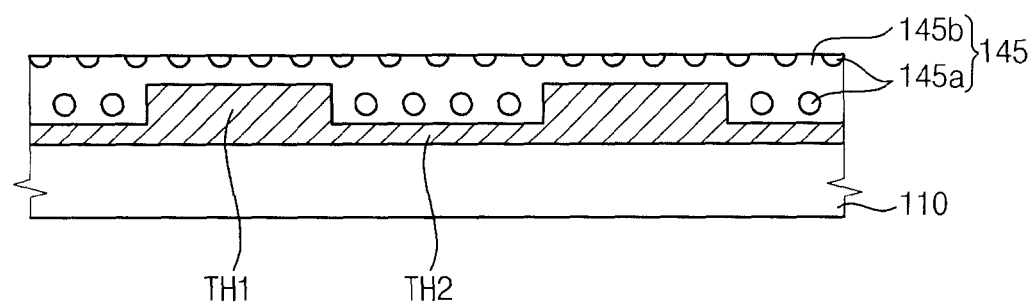

Referring to FIG. 20B, A buffer layer (not shown) including a cylindrical block copolymer is formed on the base substrate 110 having the metal pattern MP. The buffer layer is heated to form the buffer structure 145. The buffer structure 145 is substantially the same as the buffer structure illustrated in FIG. 17. Thus, the repeated explanation may be omitted.

Figure 20C:
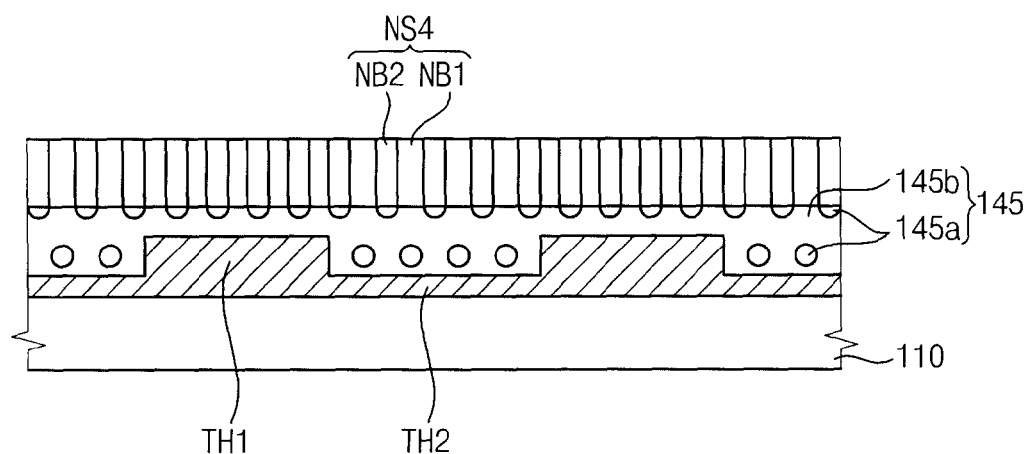

Referring to FIG. 20C, A thin film including a lamella-shaped block copolymer is formed on the base substrate 110 having the buffer structure 145. The thin film is heated to form the fourth nano-structure NS4 including the first and second nano-blocks NB1 and NB2. The first nano-block NB1 is formed on the substrate 145b, and the second nano-block NB2 is formed on the half-cylinder 145c.

Figure 20D:
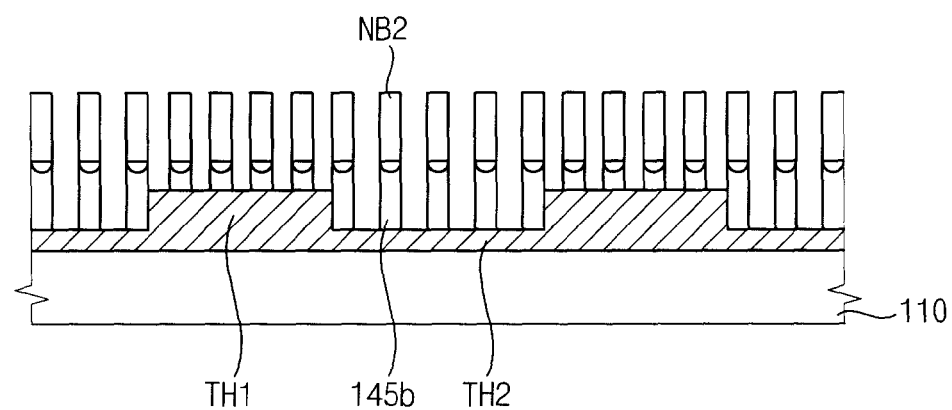

Referring to FIG. 20D, the first nano-block NB1 and the buffer structure 145 formed under the first nano-block NB1 are removed. As a result, the first nano-block NB1, a portion of a substrate 145b disposed under the fourth nano-block NB1, and a nano-cylinder 145a are removed.

For example, the first nano-block NB1, the portion of the substrate 145b and the nano-cylinder 145a may be removed by oxygen plasma. Thus, a portion of the substrate 145b, the half-cylinder 145c and the second nano-block NB2 remains on the metal layer 200. A portion of the metal pattern MP is exposed through remaining fourth nano-structure NS4.

Thereafter, the metal pattern MP is etched by using the remaining fourth nano-structure NS4, and the remaining fourth nano-structure NS4 is removed. As a result, the fifth polarization plate PL5 including the first and second linear grid patterns 230 and 240 may be formed.

Manufacturing Example 1

Hereinafter, an example embodiment of the present invention according to a method of manufacturing a nano-structure will be explained with reference to the following Example 1.

A surface of a silicon substrate was cleaned through a piranha method. Particularly, the silicon substrate was dipped in a solution including sulfuric acid and hydrogen peroxide in a ratio of about 7:3 at a temperature of about 110° C. for about 1 hour.

PS-r-PMMA was spin-coated on the cleaned silicon substrate, and heated at a temperature of about 160° C. for about 48 hours, and then cleaned by toluene to form a neutral layer having a thickness of about 6 nm.

After SU8 (trade name, MicroChem Corp., U.S.A) was spin-coated on the silicon substrate having the neutral layer, a light was irradiated onto the silicon substrate by I-line aligner, of which the trade name is MDA-6000 DUV (Midas, Korea), to form a photoresist pattern having a height of about 300 nm and a width of about 300 nm to about 800 nm.

PS-b-PMMA was spin-coated on the silicon substrate having the photoresist pattern, and heated at a temperature of about 250° C. for about 48 hours to form a sacrifice structure. A molecular weight ratio of the PS-b-PMMA was about 52,000:52,000, and $f_A$ of PMMA was about 0.5.

After PMMA was selectively removed from the sacrifice structure, the neutral layer was oxidized by using the photoresist pattern and a remaining PS portion as a mask. Thereafter, the silicon substrate having the photoresist pattern and the PS portion was dipped in toluene, and then sonicated. Thereafter, PS-b-PMMA having a lamella shape was spin-coated on the silicon substrate, and heated at a temperature of about 250° C. to form a nano-structure.

Through an observation of the nano-structure, it can be noted that PMMA that is relatively hydrophilic was disposed on the oxidized neutral layer and that PS that is relatively hydrophobic was disposed on a remaining portion of the neutral layer. Furthermore, it can be noted that PMMA and PS were arranged in a direction on the silicon substrate as illustrated in FIG. 3D.

Manufacturing Example 2

Hereinafter, an example embodiment of the present invention according to a method of manufacturing a nano-structure will be explained with reference to the following Example 2.

A surface of a silicon substrate was cleaned through a piranha method. Particularly, the silicon substrate was dipped in a solution including sulfuric acid and hydrogen peroxide in a ratio of about 7:3 at a temperature of about 110° C. for about 1 hour.

PS-r-PMMA was spin-coated on the cleaned silicon substrate, and heated at a temperature of about 160° C. for about 48 hours, and then cleaned by toluene to form a neutral layer having a thickness of about 6 nm.

After SU8 (trade name, MicroChem Corp., U.S.A) was spin-coated on the silicon substrate having the neutral layer, a light was irradiated onto the silicon substrate by I-line aligner, of which the trade name is MDA-6000 DUV (Midas, Korea), to form a photoresist pattern having a height of about 300 nm and a width of about 300 nm to about 800 nm.

PS-b-PMMA was spin-coated on the silicon substrate having the photoresist pattern, and heated at a temperature of about 250° C. for about 48 hours to form a sacrifice structure. A molecular weight ratio of the PS-b-PMMA was about 46,000:21,000, and $f_A$ of PMMA was about 0.31.

After PMMA was selectively removed from the sacrifice structure, the neutral layer was oxidized by using the photoresist pattern and a remaining PS portion as a mask. Thereafter, the silicon substrate having the photoresist pattern and the PS portion was dipped in toluene, and then sonicated. Thereafter, PS-b-PMMA having a lamella shape was spin-coated on the silicon substrate, and heated at a temperature of about 250° C. to form a nano-structure.

Through an observation of the nano-structure, it can be noted that PMMA that is relatively hydrophilic was disposed on the oxidized neutral layer and that PS that is relatively hydrophobic was disposed on a remaining portion of the neutral layer. Furthermore, it can be noted that PMMA was cylindrically arranged on the silicon substrate as illustrated in FIG. 7A.

According to embodiments of the present invention, a nano-structure may be easily formed on a substrate having a large-size by using a block copolymer. The nano-structure may be used for forming a polarization plate including a linear grid and forming a reflective lens of a reflective liquid crystal display device, etc.

Furthermore, the nano-structure may be used as a mold for forming a nano-wire transistor and a memory, for forming an electronic element for nano-scaled line-patterning, for forming a catalyst for a solar cell and a fuel cell, for forming an etching mask and an organic light emitting diode cell and for forming a gas sensor.

Furthermore, the method of manufacturing a polarization plate may be used for a polarization portion integrally formed with a display panel as well as for an individual polarization plate. Particularly, the method may be used for a process of forming the polarization portion directly on a color filter substrate or an array substrate including a thin-film transistor.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a nano-structure, the method comprising:
    forming a photoresist pattern on a base substrate including a neutral layer;
    forming a sacrifice structure including a first sacrifice block and a second sacrifice block on the base substrate having the photoresist pattern, the sacrifice structure being formed from a first thin film including a first block copolymer;
    removing the first sacrifice block from the sacrifice structure;
    after removing the first sacrifice block, oxidizing the neutral layer by using the second sacrifice block as a mask to form a chemical pattern;
    after oxidizing the neutral layer, removing the second sacrifice block and the photoresist pattern from the base substrate having the chemical pattern; and
    forming a nano-structure on the base substrate having the chemical pattern, after removing the second sacrifice block and the photoresist pattern, the nano-structure being formed from a second thin film including a second block copolymer.

2. The method of claim 1, wherein the first and second block copolymers have a lamella shape.

3. The method of claim 1, wherein the first and second block copolymers have a cylindrical shape.

4. The method of claim 1, wherein the photoresist pattern includes a plurality of partition portions extending in a first direction on the base substrate and being repeatedly arranged in a second direction different from the first direction, and the first thin film and the sacrifice structure are formed between the partition portions adjacent to each other.

5. A method of manufacturing a nano-structure, the method comprising:
    forming a photoresist pattern on a base substrate, the photoresist pattern including a convex portion and a concave portion, which are repeatedly arranged in a first direction and extend in a second direction different from the first direction;
    forming a neutral layer on the base substrate to cover the photoresist pattern; and
    forming a nano-structure on the base substrate having the neutral layer, the nano-structure being formed from a thin film including a block copolymer.

6. The method of claim 5, wherein forming the photoresist pattern comprises:
    forming a plurality of supporting patterns extending in the second direction and being spaced apart from each other in the first direction;
    coating a photoresist composition on the base substrate having the supporting patterns to form the convex portion in an area overlapping with the supporting pattern; and
    forming the concave portion between the supporting patterns adjacent to each other.

7. The method of claim 5, wherein the photoresist pattern is formed by using a half-tone mask including a light-blocking portion corresponding to the convex portion and a half-tone portion corresponding to the concave portion.

8. The method of claim 5, wherein the block copolymer is spontaneously arranged due to a thickness gradient of the photoresist pattern to form the nano-structure.

9. The method of claim 5, wherein the nano-structure includes a first nano-block arranged in the second direction and a second nano-block disposed adjacent to the first nano-block in the first direction, and the first and second nano-blocks are repeatedly arranged in the first direction.

10. A method of manufacturing a nano-structure, the method comprising:
    forming a photoresist pattern on the base substrate;
    forming a buffer structure on the base substrate to cover the photoresist pattern, the buffer structure being formed from a buffer layer including a cylindrical block copolymer; and
    forming a nano-structure directly on the buffer structure, the nano-structure being formed from a thin film including a lamella-shaped block copolymer.

11. The method of claim 10, wherein the photoresist pattern includes a plurality of partition portions extending in a first direction on the base substrate and being repeatedly arranged in a second direction different from the first direction.

12. The method of claim 11, wherein the buffer structure comprises:
- a plurality of nano-cylinders extending in the first direction between the partition portions adjacent to each other and being arranged in the second direction;
- a plurality of half-cylinders disposed on the base substrate having the partition portions and the nano-cylinders, the half-cylinders extending in the first direction and being arranged in the second direction; and
- a substrate disposed between the nano-cylinders and the half-cylinders.

13. The method of claim 12, wherein the nano-structure includes a first nano-block and a second nano-block corresponding to the half-cylinders, and the first and second nano-blocks extend in the first direction and are repeatedly arranged in the second direction.

14. A method of manufacturing a pattern, the method comprising:
- forming a sacrifice structure on a base substrate having a mother thin film, a neutral layer and a photoresist pattern, which are sequentially formed on the base substrate, the sacrifice structure including a first sacrifice block and a second sacrifice block and being formed from a first thin film including a first block copolymer;
- removing the first sacrifice block from the sacrifice structure;
- after removing the first sacrifice block, oxidizing the neutral layer by using the second sacrifice block to form a chemical pattern;
- after oxidizing the neutral layer, removing the second sacrifice block and the photoresist pattern from the base substrate having the chemical pattern;
- forming a nano-structure on the base substrate having the chemical pattern, after removing the second sacrifice block and the photoresist pattern, the nano-structure including a first nano-block and a second nano-block and being formed from a second thin film including a second block copolymer;
- removing the first nano-block; and
- patterning the mother thin film by using the second nano-block as a mask to form a pattern.

15. A method of manufacturing a pattern, the method comprising:
- forming a photoresist pattern on a base substrate, the photoresist pattern including a convex portion and a concave portion, which extend in a first direction and are repeatedly arranged in a second direction different from the first direction;
- sequentially forming a mother thin film and a neutral layer on the base substrate to cover the photoresist pattern;
- forming a nano-structure on the base substrate having the neutral layer, the nano-structure including a first nano-block and a second nano-block and being formed from a thin film including a block copolymer;
- removing the first nano-block; and
- patterning the mother thin film by using the second nano-block as a mask to form a pattern.

16. A method of manufacturing a pattern, the method comprising:
- forming a photoresist pattern on a base substrate, the photoresist pattern including a convex portion and a concave portion, which are arranged in a first direction and extend in a second direction different from the first direction;
- forming a neutral layer on the base substrate to cover the photoresist pattern;
- forming a nano-structure on the base substrate having the neutral layer, the nano-structure including a first nano-block and a second nano-block and being formed from a thin film including a block copolymer;
- forming a mother thin film on the nano-structure, of which a portion is removed; and
- removing an upper portion of the second nano-block and a portion of the mother thin film, which is disposed on the second nano-block to form a pattern.

17. The method of claim 16, wherein the mother thin film is formed on the base substrate having the second nano-block after the first nano-block is removed.

18. The method of claim 16, wherein the mother thin film is formed on the base substrate having a remaining portion of the first nano-block and the second nano-block after the portion of the nano-structure is removed, and the pattern is formed on the remaining portion of the first nano-block.

19. A method of manufacturing a pattern, the method comprising:
- forming a photoresist pattern on a base substrate having a mother thin film;
- forming a buffer structure on the base substrate to cover the photoresist pattern, the buffer structure formed from a buffer layer including a cylindrical block copolymer; and
- forming a nano-structure directly on the buffer structure, the nano-structure including a first nano-block and a second nano-block and being formed from a thin film including a lamella-shaped block copolymer;
- removing the first nano-block and a portion of the buffer structure disposed under the first nano-block; and
- patterning the mother thin film exposed through a remaining portion of the buffer structure and the second nano-block.

20. The method of claim 19, wherein the photoresist pattern includes a plurality of partition portions extending in a first direction on the base substrate and being repeatedly arranged in a second direction different from the first direction.

21. The method of claim 20, wherein the buffer structure comprises:
- a plurality of nano-cylinders extending in the first direction between the partition portions adjacent to each other and being arranged in the second direction;
- a plurality of half-cylinders disposed on the base substrate having the partition portions and the nano-cylinders, the half-cylinders extending in the first direction and being arranged in the second direction; and
- a substrate disposed between the nano-cylinders and the half-cylinders.

22. A method of manufacturing a pattern, the method comprising:
- patterning a mother thin film formed on a base substrate to form a metal pattern including a first thickness portion and a second thickness portion thinner than the first thickness portion;
- forming a buffer structure on the base substrate having the metal pattern, the buffer structure being formed from a buffer layer including a cylindrical block copolymer; and
- forming a nano-structure on the base substrate having the buffer structure, the nano-structure including a first nano-block and a second nano-block and being formed from a preliminary layer including a lamella-shaped block copolymer;

removing the first nano-block and a portion of the buffer structure disposed under the first nano-block; and patterning the mother thin film exposed through a remaining portion of the buffer structure and the second nano-block.

23. The method of claim 22, wherein the buffer structure comprises:

a plurality of nano-cylinders disposed on the second thickness portion;

a plurality of half-cylinders disposed on the nano-cylinders and the first thickness portion; and a substrate disposed between the nano-cylinders and the half-cylinders.

* * * * *

UNITED STATES PATENT AND TRADEMARK OFFICE
CERTIFICATE OF CORRECTION

PATENT NO.        : 8,486,613 B2
APPLICATION NO.   : 12/636202
DATED             : July 16, 2013
INVENTOR(S)       : Sang-Ouk Kim et al.

It is certified that error appears in the above-identified patent and that said Letters Patent is hereby corrected as shown below:

Title Page, Item (73), Assignee, delete "Samsung Electronics Co., Ltd. (KR); Korea Advanced Institute of Science and Technology (KR)" and insert therefor -- Samsung Display Co., Ltd. (KR); Korea Advanced Institute of Science and Technology (KR) --

Signed and Sealed this
Twenty-fourth Day of September, 2013

Teresa Stanek Rea
*Deputy Director of the United States Patent and Trademark Office*